(12) United States Patent
Yonezawa

(10) Patent No.: US 7,222,319 B2
(45) Date of Patent: May 22, 2007

(54) TIMING ANALYSIS METHOD AND APPARATUS

(75) Inventor: Hirokazu Yonezawa, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 94 days.

(21) Appl. No.: 11/101,572

(22) Filed: Apr. 8, 2005

(65) Prior Publication Data

US 2005/0276135 A1   Dec. 15, 2005

(30) Foreign Application Priority Data

Jun. 10, 2004   (JP)   .............................. 2004-173113

(51) Int. Cl.
*G06F 17/50* (2006.01)

(52) U.S. Cl. ............................ 716/6; 703/19

(58) Field of Classification Search .................. 716/4, 716/6; 703/2, 15, 19; 702/108; 438/14
See application file for complete search history.

(56) References Cited

U.S. PATENT DOCUMENTS

| | | | | |
|---|---|---|---|---|
| 5,274,568 A * | 12/1993 | Blinne et al. ................... | 716/6 |
| 5,845,233 A * | 12/1998 | Fishburn ..................... | 702/108 |
| 5,896,299 A * | 4/1999 | Ginetti et al. .................. | 716/4 |
| 6,090,152 A * | 7/2000 | Hayes et al. ................... | 716/6 |
| 6,484,297 B1 * | 11/2002 | Dixit et al. ...................... | 716/6 |
| 6,795,802 B2 * | 9/2004 | Yonezawa et al. ............. | 703/19 |
| 6,820,048 B1 * | 11/2004 | Bhutani et al. ................ | 703/15 |
| 6,869,808 B2 * | 3/2005 | Yonezawa et al. ............ | 438/14 |
| 7,010,475 B2 * | 3/2006 | Ehrler .......................... | 703/15 |
| 7,020,589 B1 * | 3/2006 | Datta Ray et al. .............. | 703/2 |
| 7,092,838 B1 * | 8/2006 | Srinivas et al. ............. | 702/117 |
| 2004/0122642 A1 * | 6/2004 | Scheffer ...................... | 703/14 |
| 2004/0167756 A1 * | 8/2004 | Yonezawa ...................... | 703/2 |
| 2004/0254776 A1 | 12/2004 | Andou | |
| 2005/0050499 A1 | 3/2005 | Matsumoto et al. | |
| 2005/0060676 A1 * | 3/2005 | Matsumura et al. ........... | 716/6 |
| 2005/0081171 A1 * | 4/2005 | Kawano et al. ................ | 716/6 |

FOREIGN PATENT DOCUMENTS

| | | |
|---|---|---|
| JP | 09-311877 | 12/1997 |
| JP | 2000-040098 | 2/2000 |
| JP | 2001-306647 A | 11/2001 |
| JP | 2002-222232 | 8/2002 |

* cited by examiner

*Primary Examiner*—Leigh M. Garbowski
(74) *Attorney, Agent, or Firm*—McDermott Will & Emery LLP

(57) ABSTRACT

A timing analysis apparatus reads a net list including connection information and the like of circuit cells of an LSI, delay data for previously storing delay information of the circuit cells, stage count-derating factor dependency and components P, V and T of a derating factor; detects the number of stages of each signal path by a signal path cell counting section; determines a derating factor corresponding to the extent of averaging of random variation of each signal path in accordance with the number of stages of the signal path; and performs timing analysis on the basis of the determined derating factor. Therefore, more realistic and highly accurate timing design can be performed on a large-scale circuit.

11 Claims, 17 Drawing Sheets

| STAGE COUNT N | $K_n$ |
|---|---|
| 1 | 1 |
| 2 | 0.97 |
| 3 | 0.95 |
| ⋮ | ⋮ |
| 10 | 0.90 |

| SIGNAL PATH | STAGE COUNT | WORST DELAY [nS] | |
|---|---|---|---|
| | | CONVENTIONAL | INVENTION |
| A | 3 | 0.608 | 0.578 |
| B | 2 | 0.362 | 0.351 |
| C | 1 | 0.165 | 0.165 |

| STAGE COUNT N | $K_n$ |
|---|---|
| 1 | 1 |
| 2 | 1.03 |
| 3 | 1.05 |
| ⋮ | ⋮ |
| 10 | 1.10 |

| SIGNAL PATH | STAGE COUNT | BEST DELAY [nS] ||
|---|---|---|---|
| | | CONVENTIONAL | INVENTION |
| A | 3 | 0.198 | 0.208 |
| B | 2 | 0.118 | 0.121 |
| C | 1 | 0.054 | 0.054 |

| STAGE COUNT N | $K_n$ | | |
|---|---|---|---|
| | R=1.0 | R=0.5 | R=0 |
| 1 | 1 | 1 | 1 |
| 2 | 1 | 0.985 | 0.97 |
| 3 | 1 | 0.975 | 0.95 |
| ⋮ | ⋮ | ⋮ | ⋮ |
| 10 | 1 | 0.95 | 0.90 |

| SIGNAL PATH | STAGE COUNT | WORST DELAY [nS] | | | |
|---|---|---|---|---|---|
| | | CONVEN-TIONAL | INVENTION | | |
| | | | R=1.0 | R=0.5 | R=0 |
| A | 3 | 0.608 | 0.608 | 0.593 | 0.578 |
| B | 2 | 0.362 | 0.362 | 0.356 | 0.351 |
| C | 1 | 0.165 | 0.165 | 0.165 | 0.165 |

FIG. 22

| | 121a | 121b | 121c | 121d |
|---|---|---|---|---|
| Path A | | | | |
| INV_in(501) | | | 0 | f |
| INV_out(501) | | 0.1645 | 0.1645 | r |
| NAND_in(502) | | | 0.1645 | r |
| NAND_out(502) | | 0.1973 | 0.3618 | f |
| NOR_in(503) | | | 0.3618 | f |
| NOR_out(503) | | 0.2467 | 0.6085 | r |
| | | | | |
| Path B | | | | |
| INV_in(501) | | | 0 | f |
| INV_out(501) | | 0.1645 | 0.1645 | r |
| NAND_in(502) | | | 0.1645 | r |
| NAND_out(502) | | 0.1973 | 0.3618 | f |
| | | | | |
| Path C | | | | |
| INV_in(501) | | | 0 | f |
| INV_out(501) | | 0.1645 | 0.1645 | r |

~121

| | 124a | 124b | 124c | 124d |
|---|---|---|---|---|
| Path A | | | | |
| INV_in(501) | | | 0 | f |
| INV_out(501) | | 0.1562 | 0.1645 | r |
| NAND_in(502) | | | 0.1645 | r |
| NAND_out(502) | | 0.1875 | 0.3437 | f |
| NOR_in(503) | | | 0.3437 | f |
| NOR_out(503) | | 0.2343 | 0.5780 | r |
| Path B | | | | |
| INV_in(501) | | | 0 | f |
| INV_out(501) | | 0.1595 | 0.1595 | r |
| NAND_in(502) | | | 0.1595 | r |
| NAND_out(502) | | 0.1914 | 0.3509 | f |
| Path C | | | | |
| INV_in(501) | | | 0 | f |
| INV_out(501) | | 0.1645 | 0.1645 | r |

~124

| STAGE COUNT N | $E_n$ |
|---|---|
| 1 | 1.10 |
| 2 | 1.07 |
| 3 | 1.05 |
| ⋮ | ⋮ |
| 10 | 1.00 |

| SIGNAL PATH | STAGE COUNT | WORST DELAY [nS] | |
|---|---|---|---|
| | | CONVENTIONAL | INVENTION |
| A | 3 | 0.669 | 0.639 |
| B | 2 | 0.398 | 0.387 |
| C | 1 | 0.181 | 0.181 |

FIG. 28
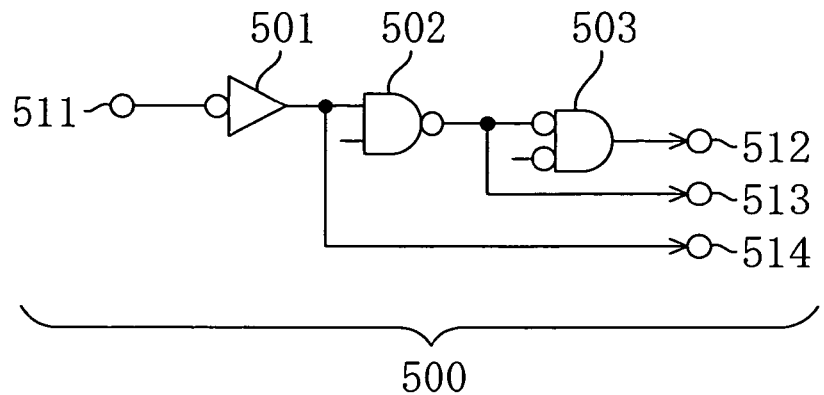
FIG. 29    PRIOR ART
| DERATING FACTOR | best | worst |
|---|---|---|
| P | 0.7 | 1.3 |
| V | 0.85 | 1.15 |
| T | 0.9 | 1.1 |
FIG. 30    PRIOR ART
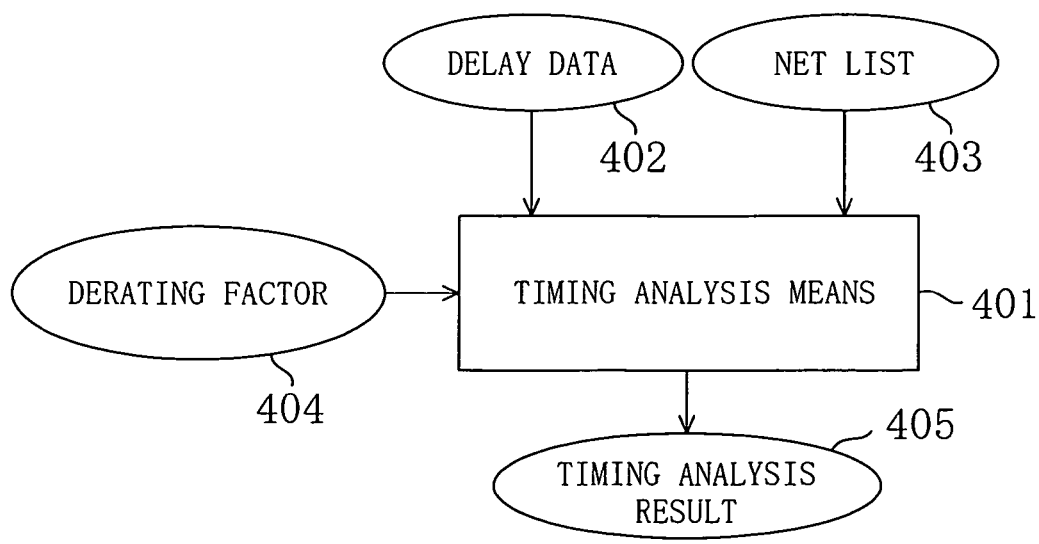

TIMING ANALYSIS METHOD AND APPARATUS

CROSS-REFERENCE TO RELATED APPLICATIONS

This application claims priority under 35 U.S.C. §119 on Patent Application No. 2004-173113 filed in Japan on Jun. 10, 2004, the entire contents of which are hereby incorporated by reference.

BACKGROUND OF THE INVENTION

The present invention relates to a technique employed in design of a system LSI, an ASIC (application specific IC) or the like for performing timing analysis with a design margin set in consideration of influence of variation mainly caused in fabrication.

Recently, refinement and the degree of integration of transistors have been rapidly improved in accordance with the development of fabrication technique, and a variety of functions can be now realized on one chip of a CMIS (complementary metal insulator semiconductor) integrated circuit (hereinafter referred to as the LSI). In developing such an LSI, a design margin is generally provided. There are various factors affecting circuit characteristics, and a design margin is a margin allowed at the stage of design so that the circuit can be normally operated even when affected by these factors. Factors to be most significantly considered in setting a design margin are factors that affect circuit characteristics. Such factors include not only the voltage and the temperature corresponding to the operation environment of the circuit but also variation or fluctuation occurring in fabrication. The fabrication variation includes, for example, variation in a processing dimension in lithography and variation in a material such as a dopant concentration. When such fabrication variation is caused, the characteristics of transistors and interconnects included in the circuit are varied, resulting in varying the characteristics of the LSI composed of these elements. Since the processing technique has recently been rapidly refined, the fabrication variation affects the circuit characteristics of an LSI more and more conspicuously.

An LSI is designed so that its various circuit characteristics can satisfy specifications, and in particular, attention is paid to the design of circuit timing. When a signal is transferred through a circuit, a signal propagation delay is caused, and the circuit is designed through timing design so that its signal propagation delay characteristic can satisfy the specification.

Such a signal propagation delay caused by variation or fluctuation occurring in fabrication of an LSI will now be described with reference to a drawing.

FIG. 31 is a block circuit diagram of an exemplified logic circuit included in an ASIC, a system LSI or the like. In general, a logic circuit is decomposed into a plurality of signal paths. One of these signal paths is, for example, a signal path 200 provided between a pair of flip-flops 211 and 212 and including N (wherein N is a natural number) stages of circuit cell groups (i.e., circuit cells Cce1 through CceN) as shown in FIG. 31. Each of the N stages of circuit cell groups is generally composed of a logic circuit element such as an inverter, a NAND, a NOR or the like. These N stages of circuit cell groups each composed of an inverter or the like are connected to one another through an interconnect, so as to form the signal path. In the timing design of such a logic circuit, a signal propagation delay time (hereinafter simply referred to as the delay time) caused through the propagation of a signal through the N stages of circuit cells connected by the signal path should be within a given time determined on the basis of a cycle time of a clock signal 201 input to the logic circuit (in most cases, on the basis of a reciprocal of the operation frequency or the clock frequency, or a cycle obtained by multiplying such a reciprocal by an integer). This relationship is represented by the following formula 1:

$$t\text{cycle} \geq \Sigma ti + t\text{others} \quad \text{Formula 1:}$$

wherein tcycle indicates the upper limit of a delay time required in the design of the logic circuit; ti indicates a time by which a signal input to a circuit cell disposed at the ith stage out of the N stages of circuit cells is delayed before being output (i.e., a delay time); $\Sigma ti$ indicates the sum of signal propagation delay times ti caused in the respective circuit cells provided between the pair of flip-flops; and tothers indicates the sum of set-up times of the pair of flip-flops and the skew of the clock signal.

In general, the design margin is set in consideration of the above-described delay time and hence is represented by formulas 2 and 3 below by using coefficients (P, V and T components) designated as a derating factor indicating, in the form of a coefficient obtained with reference to delay times under standard conditions, various delay varying factors for delaying the propagation of a signal. The component P corresponds to a derating factor in the form of a coefficient obtained by using the fabrication variation as a delay varying factor, the component V corresponds to a derating factor in the form of a coefficient obtained by using the power voltage range as a delay varying factor and the component T corresponds to a derating factor in the form of a coefficient obtained by using the temperature range as a delay varying factor.

$$t\text{worst} = t\text{typ} \times P\text{worst} \times V\text{worst} \times T\text{worst} \quad \text{Formula 2:}$$

$$t\text{best} = t\text{typ} \times P\text{best} \times V\text{best} \times T\text{best} \quad \text{Formula 3:}$$

wherein tworst indicates the worst value of the delay time $\Sigma ti$, tbest indicates the best value of the delay time $\Sigma ti$, and ttyp indicates the standard value of the delay time $\Sigma ti$.

The derating factor is used as follows: First, the standard value ttyp of the delay time $\Sigma ti$ is obtained, and thereafter, a product of the standard value ttyp by the worst values of the respective derating factor components is set as the worst value of the delay time attained under the worst conditions. Similarly, a product of the standard value by the best values of the respective derating factor components can be easily estimated as the best value of the delay time attained under the best conditions. As a result, the timing design of the logic circuit in consideration of the design margin can be performed in a labor-saving manner.

FIG. 29 is a table of exemplified specific values of the derating factor components.

In FIG. 29, the best values (in the column of "best") and the worst values (in the column of "worst") of the derating factor components P, V and T used in the formulas 2 and 3 are listed.

As shown in FIG. 29, each derating factor component P, V or T has the best value and the worst value. When the worst values of the derating factor components are substituted in the formula 2, the worst value tworst of the delay time can be calculated as represented by the following formula 4:

$$t\text{worst} = t\text{typ} \times 1.3 \times 1.15 \times 1.1 \quad \text{Formula 4:}$$

Similarly, when the best values of the derating factor components are substituted in the formula 3, the best value tbest of the delay time can be calculated as represented by the following formula 5:

$$tbest = ttyp \times 0.7 \times 0.85 \times 0.9 \qquad \text{Formula 5:}$$

Then, the operation of the LSI is checked at the stage of the circuit design under conditions where times respectively corresponding to the thus calculated best value tbest and worst value tworst are delayed. In this manner, the timing analysis method in consideration of the fabrication variation is conventionally performed.

FIG. 30 is a block diagram of the architecture of a conventional system for performing the timing analysis. A timing analysis means 401 reads a net list 403 including connection information and the like of circuit cells included in an LSI and delay data 402 previously storing delay information of the respective circuit cells present on each signal path, calculates a delay time with respect to each signal path in accordance with a derating factor 404 corresponding to a design margin in the aforementioned manner, and outputs a timing analysis result 405.

For example, the timing analysis of a circuit 500 shown in FIG. 32 is performed as follows: The circuit 500 is composed of three circuit cells 501, 502 and 503 connected to one another, and includes three signal paths, that is, a signal path A present between an input terminal 511 and an output terminal 512, a signal path B present between the input terminal 511 and an output terminal 513 and a signal path C present between the input terminal 511 and an output terminal 514. Assuming that standard delay times of the circuit cell 501, the circuit cell 502 and the circuit cell 503 are respectively 0.1 nS, 0.12 nS and 0.15 nS, the worst delays of the signal paths A, B and C are respectively obtained by using the values listed in FIG. 29 as the derating factor 404 as follows:

The worst delay of the signal path A is calculated in accordance with the following formula 6:

$$tworst[nS] = (0.1+0.12+0.15) \times 1.3 \times 1.15 \times 1.1 \qquad \text{Formula 6:}$$

The worst delay of the signal path B is calculated in accordance with the following formula 7:

$$tworst[nS] = (0.1+0.12) \times 1.3 \times 1.15 \times 1.1 \qquad \text{Formula 7:}$$

The worst delay of the signal path C is calculated in accordance with the following formula 8:

$$tworst[nS] = (0.1) \times 1.3 \times 1.15 \times 1.1 \qquad \text{Formula 8:}$$

The timing analysis on the basis of this conventional technique is also designated as gate-level or cell-level timing analysis because the analysis processing is performed with respect to each circuit cell and a circuit cell is simply designated as a gate or a cell. This timing analysis is distinguished from circuit simulation typically like "SPICE" (known as, for example, HSPICE manufactured by Synopsys, U.S.A.) for performing the analysis at a level of a transistor. In general, a circuit scale that can be dealt with by the circuit simulation is considerably small as compared with that dealt with by the gate-level analysis. A known example of commercially available EDA tools for performing the gate-level timing analysis is "Prime Time" manufactured by Synopsys, U.S.A.

The quality of an LSI can be safely secured by excessively setting a design margin for the LSI, but the circuit design may become wasteful on the contrary. For example, since an excessive margin increases the circuit scale, the performance such as the operation frequency of the LSI is lowered.

Accordingly, without a technique to set not excessive but appropriate design margin and to design an LSI on the basis of the set design margin, it is difficult to efficiently develop an LSI, such as a recent system LSI, that should be satisfactory in both the performance and the quality.

As a countermeasure against this problem, a technique disclosed in Japanese Laid-Open Patent Publication No. 2000-40098 (Abstract) is known. In a method disclosed in this publication, derating factors for the worst value and the best value are previously obtained, as a database, with respect to each kind of circuit cells included in an LSI, and the timing analysis is performed by referring to the database. In this technique, the derating factor is not uniformly applied to the whole circuit or the whole chip subjected to the timing analysis as described with reference to the formulas 6, 7 and 8, but it is possible to consider that the sensitivity of delay variation to fabrication variation is different depending upon the kind of circuit cell.

Also, a technique disclosed in Japanese Laid-Open Patent Publication No. 2002-222232 (sections [0011] and [0012]) is known. In a method disclosed in this publication, a difference in fabrication variation depending upon the position on a chip is incorporated. Specifically, derating factors for the worst value and the best value of each circuit cell included in an LSI are previously obtained in accordance with its position on a chip, and the timing analysis is performed by referring to these derating factors.

Recently, variation derived from a factor other than fabrication has become significant, and such variation is also considered in setting a design margin. For example, a new derating factor Eworst corresponding to variation derived from a factor other than the fabrication is additionally used for obtaining the worst delay in accordance with a formula 2' below. The factor other than fabrication is, for example, an error caused in characterizing a circuit cell delay (which corresponds to an interpolation error between delay library registration values described below).

$$tworst = ttyp \times Pworst \times Vworst \times Tworst \times Eworst \qquad \text{Formula 2':}$$

The new derating factor Eworst also should be set not to be excessive, and with respect to this setting, a technique disclosed in Japanese Laid-Open Patent Publication No. 9-311877 (Abstract) is known. In the technique disclosed in this publication, a derating factor (an error coefficient) corresponding to the maximum error is previously obtained, as a database, with respect to each kind of circuit cell included in an LSI, and the timing analysis is performed by referring to the database.

SUMMARY OF THE INVENTION

The fabrication variation σtotal is divided into an intra-chip variation component σin and an extra-chip variation component σout, which are substantially represented by the following Formula 9:

$$\sigma total = (\sigma in^2 + \sigma out^2)^{0.5} \qquad \text{Formula 9:}$$

The extra-chip variation component σout, as known as chip-to-chop variation component, is a component not varied but uniform within a chip, and corresponds to variation that the whole elements such as transistors included in an LSI are similarly varied. The extra-chip variation component includes variation among lots, wafers and chips. The intra-chip variation component σin corresponds to variation caused among respective elements such as transistors included in an LSI.

It is noted that the influence on the circuit characteristics, namely, on the timing, of the extra-chip variation component and that of the intra-chip variation component are not the same. In the aforementioned conventional technique and the techniques disclosed in Japanese Laid-Open Patent Publication Nos. 2000-40098 and 2002-222232, this difference in the influence on the timing characteristics between the different components of the fabrication variation is not considered. For example, in the case where a signal is propagated through a signal path in the circuit shown in FIG. 32, the worst delay of the signal path is calculated by obtaining a sum of the worst delays of the respective circuit cells. In this method, the influence of the variation among the chips, that is, the variation caused when the circuit cells included in the chip are similarly varied, can be considered. However, the intra-chip variation component is not the variation caused when the circuit cells are similarly varied but the variation caused when the circuit cells are indiscriminately, namely, randomly, varied and therefore, the intra-chip variation cannot be taken into consideration by using the simple sum of the worst delays. Actually, both the intra-chip variation component and the extra-chip variation component mixedly affect the circuit characteristics, and hence, it is not easy to determine an appropriate design margin.

Furthermore, in the conventional technique, in order to consider the delay error, that is, the variation factor other than those derived from the fabrication, it is necessary to previously obtain delay errors of respective kinds of circuit cells and register them in a library, which largely increases the number of procedures. This variation is also not the variation caused similarly in the circuit cells but the variation caused indiscriminately, namely, substantially randomly, in the respective circuit cells in a random logic circuit.

An object of the invention is realistically determining a design margin, which is used in timing design of an LSI, mainly in consideration of properties of the fabrication variation, so as to provide timing analysis method and apparatus using the design margin.

In the first timing analysis method of this invention, with respect to each of a plurality of signal paths of an LSI in each of which a plurality of circuit cells are serially connected to one another, a design margin of each signal path corrected in accordance with a logic depth, such as the number of stages of circuit cells, of the signal path is calculated, so as to calculate a delay into which the corrected design margin of each signal path is introduced.

In this method, the design margin of each signal path can be corrected in accordance with the degree of variation different depending upon the number of stages or the like of circuit cells included therein, and hence, a delay excluding an excessive margin can be obtained.

Preferably, a derating factor and a correction coefficient for the derating factor are used as the design margin, and the correction coefficient of the design margin is calculated in accordance with the logic depth.

Furthermore, when a relationship between a logic depth and an extent of averaging of delay variation of each of the signal paths is previously obtained and the corrected design margin is obtained by using the relationship, the timing analysis can be performed more rapidly.

The averaging of delay variation includes averaging of delay variation caused by random variation of an intra-chip variation component of the fabrication variation, averaging of delay errors, or both the averaging.

Preferably, each of the plurality of signal paths is sandwiched between two flip-flops operated at the same timing.

The plurality of signal paths may include a signal path included in a clock line supply circuit and having a clock tree structure in which circuit cells are arranged.

Also, when the design margin is calculated through correction in a different ratio in accordance with a region where each of the signal paths is disposed within a chip, the timing analysis influenced by a difference in the configuration of each element of the chip derived from the characteristics of an optical system of a fabrication apparatus can be performed.

In the second timing analysis method, with respect to each of a plurality of signal paths of an LSI in each of which a plurality of circuit cells are serially connected to one another, timing (a delay) of each signal path obtained before correcting a design margin is calculated, a correction value of the design margin of each signal path is calculated in accordance with a logic depth, such as the number of circuit cells, of each signal path, and the design margin is corrected with the correction value before calculating a delay into which the corrected design margin of each signal path is incorporated by referring to the timing obtained before the correction.

In this method, when an apparatus for the correction is added to a conventional timing analysis apparatus, the design margin of each signal path can be corrected in accordance with the degree of variation different depending upon the number of stages of circuit cells or the like of each signal path, and therefore, a delay excluding an excessive margin can be more inexpensively obtained.

The timing analysis apparatus of this invention includes means for detecting a logic depth of each of a plurality of signal paths of an LSI in each of which a plurality of circuit cells are serially connected to one another, means for calculating a corrected design margin of each signal path by using the detected logic depth of the corresponding signal path, and means for calculating a delay of each signal path into which the corrected design margin of the corresponding signal path is incorporated.

Thus, the design margin of each signal path can be corrected in accordance with the degree of variation different depending upon the number of stages of circuit cells or the like of each signal path, and therefore, a delay excluding an excessive margin can be obtained.

As described so far, in the timing analysis method or the timing analysis apparatus for an LSI according to this invention, a design margin can be set in consideration of the characteristics of each signal path with a plurality of differently behaving fabrication variation components superimposed. Accordingly, more realistic and highly accurate timing design can be performed on a large-scale circuit.

Moreover, a design margin can be set in consideration of a variation factor other than fabrication variation in a labor-saving manner, and hence, more realistic and highly accurate timing design can be performed on a large-scale circuit.

BRIEF DESCRIPTION OF THE DRAWINGS

FIG. 22 is a diagram for showing an example of a format of a first timing analysis result used in Embodiment 2;

FIG. 28 is a block diagram of a circuit to be subjected to timing analysis in each embodiment of the invention;

FIG. 29 is a table for listing examples of specific values of a derating factor;

FIG. 30 is a block diagram for showing the architecture of a system used for performing conventional timing analysis;

DETAILED DESCRIPTION OF THE INVENTION

Embodiment 1

Now, a timing analysis apparatus for an LSI according to Embodiment 1 of the invention in which fabrication variation is taken into consideration will be described with reference to the accompanying drawings.

Figure 1:
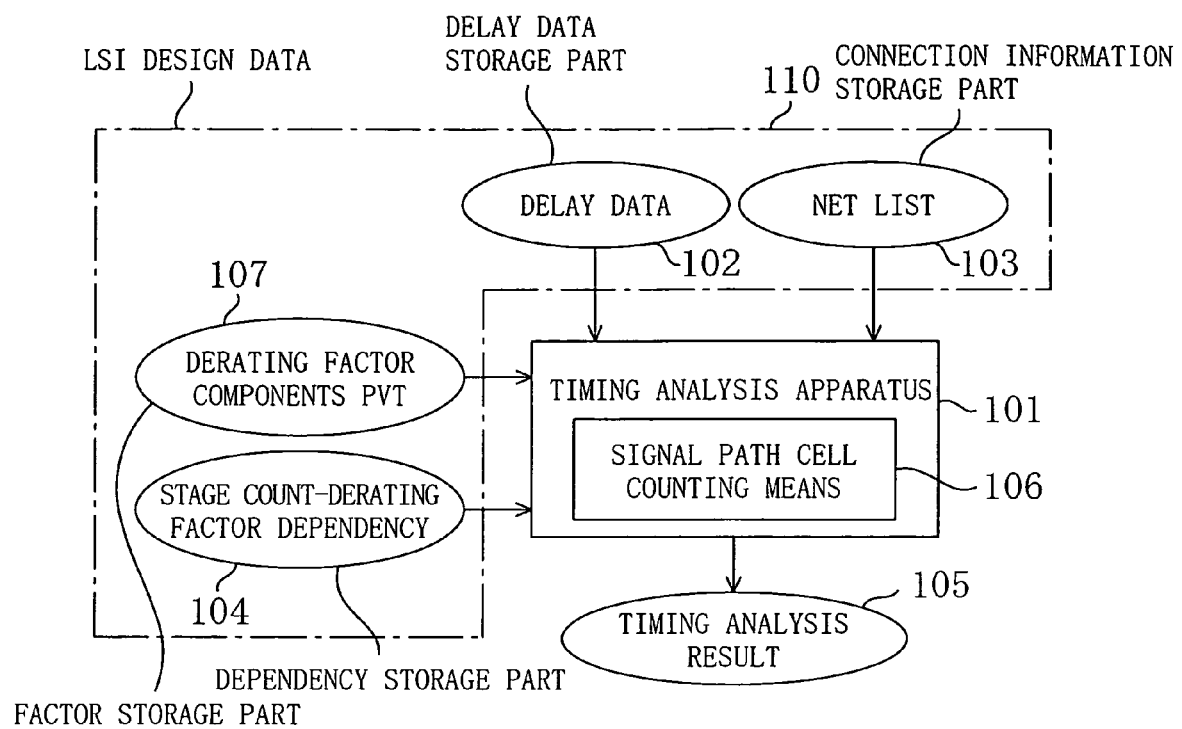
FIG. 1 is a block diagram for showing the architecture of a system used for performing timing analysis for an LSI according to Embodiment 1 of the invention.

FIG. 1 is a block diagram for showing the architecture of a system used for performing the timing analysis for an LSI according to Embodiment 1 of the invention. As shown in FIG. 1, a timing analysis apparatus 101 performs the timing analysis on the basis of information supplied from respective information storage parts of LSI design data 110 in which information on the LSI is comprehensively stored. The LSI design data 110 includes a connection information storage part for storing a net list 103 describing connection information and the like of circuit cells included in the LSI; a delay information storage part for previously storing delay data 102 describing delay information of the circuit cells; a dependency storage part for storing stage count-derating factor dependency 104; and a factor storage part for storing a derating factor (components P, V and T) 107. It is noted that the connection information storage part, the delay information storage part, the dependency storage part and the factor storage part may be included in a memory (storage means) other than the LSI design data 110.

The timing analysis apparatus 101 reads the net list 103, the delay data 102, the stage count-derating factor dependency 104 and the derating factor (components P, V and T) 107, and outputs a timing analysis result 105. Also, the timing analysis apparatus 101 is provided with signal path cell counting means 106.

Figure 2:
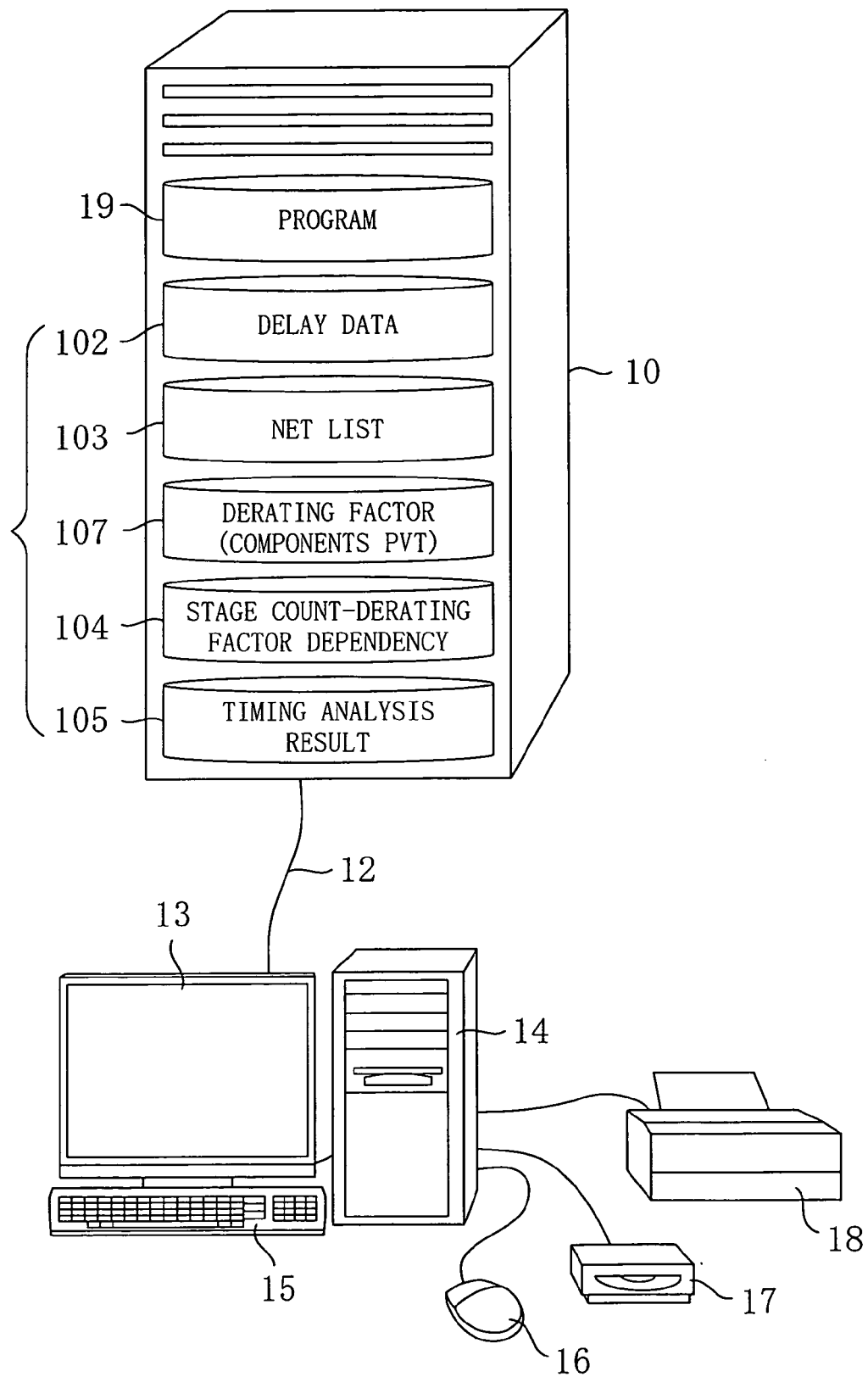
FIG. 2 is a schematic diagram for showing the architecture of a computer system used in the timing analysis of this invention.

FIG. 2 is a schematic diagram for showing the architecture of a computer system used in the timing analysis of this invention. Although FIG. 2 shows the architecture in which the timing analysis apparatus of this embodiment is incorporated into a computer system, a computer system similar to that of FIG. 2 may be used in any of other embodiments described below.

As shown in FIG. 2, the computer system includes a main computer 10 and a terminal computer 14 connected to the main computer 10 via a network 12. A storage device of the main computer 10 stores the delay data 102, the net list 103, the stage count-derating factor dependency 104, the derating factor 107 and the timing analysis result 105 as well as a program 19 describing procedures of the analysis. Also, the terminal computer 14 is connected to a display (an output device) 13, a keyboard (an input device) 15, a mouse (an input device) 16, an external storage device 17 and a printer (an output device) 18. As the main computer 10 and the terminal computer 14, any general computer containing a CPU, a RAM, a ROM, a hard disk, an interface and the like may be used.

When a user instructs the analysis to the main computer 10 by operating the terminal computer 14 with the input devices, the main computer 10 executes the timing analysis in accordance with the program 19. The user gets the timing analysis result 105 generated as a result of the analysis from the terminal computer 14 through the network 12 and makes it output from the output device. Specifically, the user makes the result displayed on the display 13 or printed by the printer 18.

Figure 3:
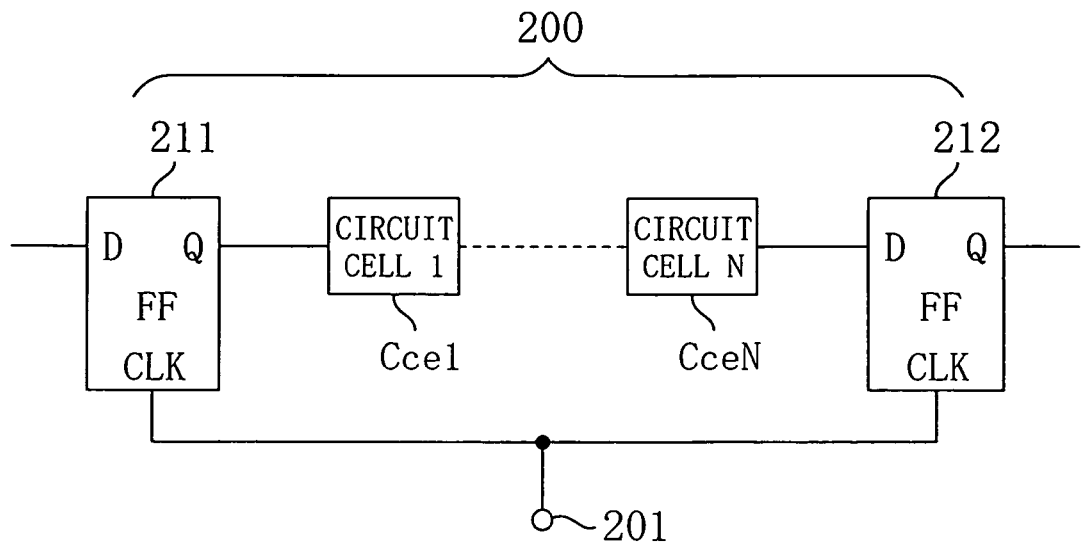
FIG. 3 is a block diagram for showing a unit of a signal path for defining the number of stages of circuit cells in Embodiment 1.

At this point, a unit of a signal path employed in this embodiment will be described. FIG. 3 is a block diagram for showing a unit of a signal path for defining the number of stages of circuit cells employed in this embodiment. As shown in FIG. 3, a signal path connects two flip-flops 211 and 212 operated at the same timing to each other, and if there are N circuit cells Cce1 through CceN serially connected on this signal path, the number of stages of the signal path 200 is defined as N. In the example shown in FIG. 3, the clock terminals CLK of the two flip-flops 211 and 212 are connected to a common clock output terminal 201, but the two flip-flops 211 and 212 need not always be connected to the common clock output terminal as described below. Also, a unit of a circuit cell for defining the number of stages will be described later.

Figure 4:
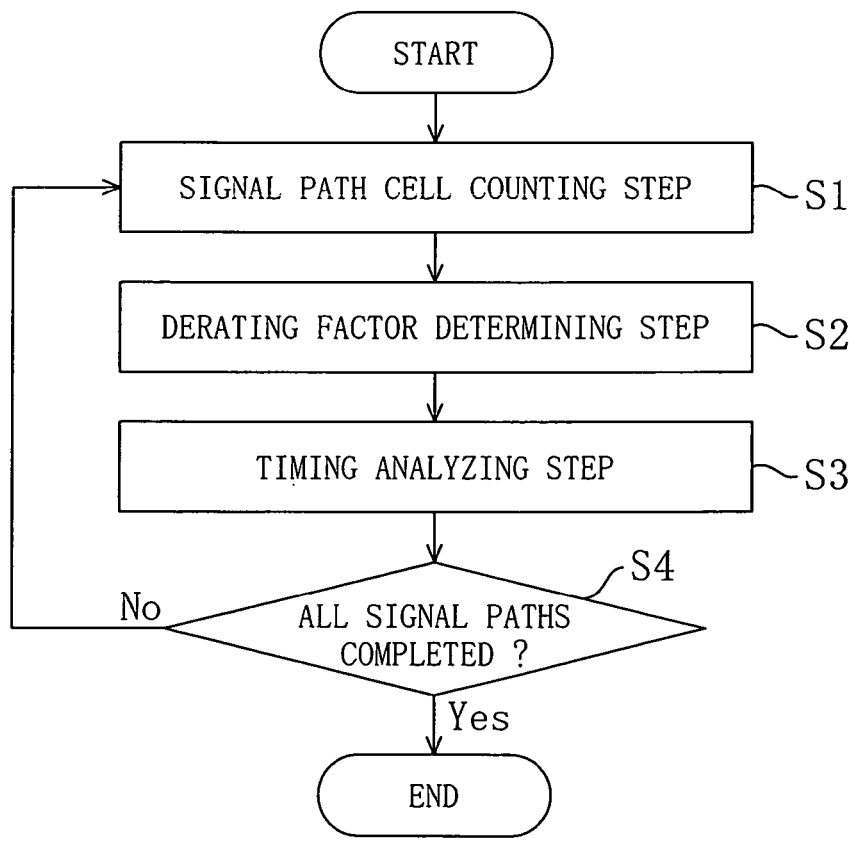
FIG. 4 is a flowchart for showing analysis procedures employed in a timing analysis apparatus for an LSI of Embodiment 1 in which fabrication variation is taken into consideration.

FIG. 4 is a flowchart for showing procedures in the analysis performed by the timing analysis apparatus for an LSI of this embodiment in which fabrication variation is taken into consideration. In this flowchart, step S1 is a signal path cell counting step, step S2 is a derating factor determining step, and step S3 is a timing analyzing step.

Signal Path Cell Counting Step

The timing analysis apparatus 101 reads the net list 103 including the connection information and the like of circuit cells included in the LSI and the delay data 102 previously storing delay information of the circuit cells. The net list 103 stores the connection information and the like of the circuit cells included in the circuit subjected to the timing analysis. The delay data 102 stores information of a delay time of each stage (composed of a path from the input to the output of a given circuit cell and a path from the output through an interconnect connected thereto to the input of a circuit cell disposed at the next stage) of the signal path. The delay time itself described in the delay data 102 is determined on the basis of the output load capacitance and the input waveform different among the respective circuit cells by referring to, for example, a library corresponding to dependency of the delay time on the output load capacitance and the input waveform of each circuit cell in accordance with the kind of cell. Even the same kind of cells have different delay times when the operation conditions such as the output load capacitance in the circuit and the input waveform are different. It is noted that the delay data 102 is data described by using "Standard Delay Format" (Open Verilog International, 1995) or the like.

Figure 32:
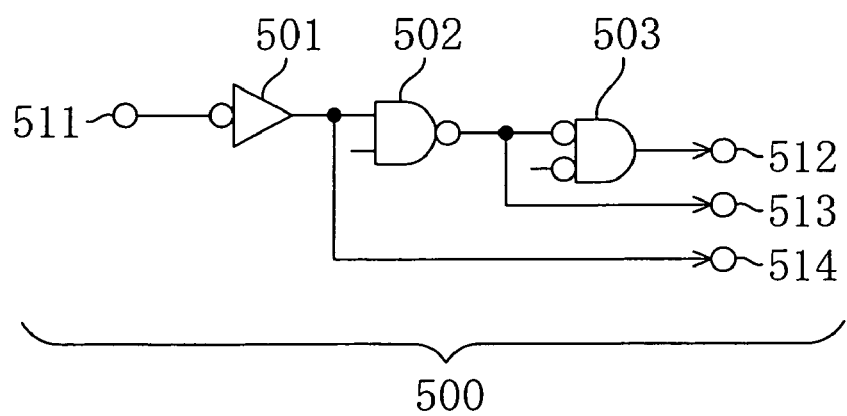
FIG. 32 is a block diagram of a circuit to be subjected to the conventional timing analysis.

The signal path cell counting means 106 counts the number of stages of circuit cells arranged from the input to the output of each signal path of the circuit and stores the information of the number of stages in the storage device. For example, in a circuit shown in FIG. 28 (which is a circuit similar to the circuit of FIG. 32 used in describing the conventional technique), a signal path A present between an input terminal 511 and an output terminal 512 is determined to have three stages of circuit cells, a signal path B present between the input terminal 511 and an output terminal 513 is determined to have two stages of circuit cells, and a signal path C present between the input terminal 511 and an output terminal 514 is determined to have one stage of circuit cell. It is noted that the input terminal 511 and the output terminals 512, 513 and 514 of FIG. 28 are respectively directly connected to flip-flops operated in accordance with a common clock.

Derating Factor Determining Step

First, the timing analysis apparatus 101 reads the derating factor 107 including the components P, V and T. At this point, a new derating factor correction coefficient Kn ($\leq 1.0$) is introduced. In general, the worst delay (the maximum delay) is calculated in accordance with the following formula 10:

$$t\text{worst} = t\text{typ} \times P\text{worst} \times V\text{worst} \times T\text{worst} \times Kn \quad \text{Formula 10:}$$

The timing analysis apparatus 101 stores the result of this calculation in the storage device.

At this point, the coefficient Kn used in the formula 10 represents an effect that the intra-chip variation randomly caused is averaged along a signal path, and is a correction coefficient for correcting the derating factor representing the conventional fabrication variation in the form of coefficients. The extent that the intra-chip variation is averaged along the signal path depends upon the logic depth of the signal path. Herein, the logic depth is assumed to correspond to the number of stages of circuit cells (hereinafter simply referred to as the stage count) for simplification. When the stage count is small, the extent of averaging is small and the coefficient Kn has a value approximated to 1.0. The correction coefficient Kn being 1.0 means that random variation is not averaged, namely, that the variation is regarded to have the same property as the extra-chip variation component. On the contrary, when the stage count is large, the variation is averaged, and the derating factor correction coefficient Kn has a small value.

Figures 5, 6, 7:
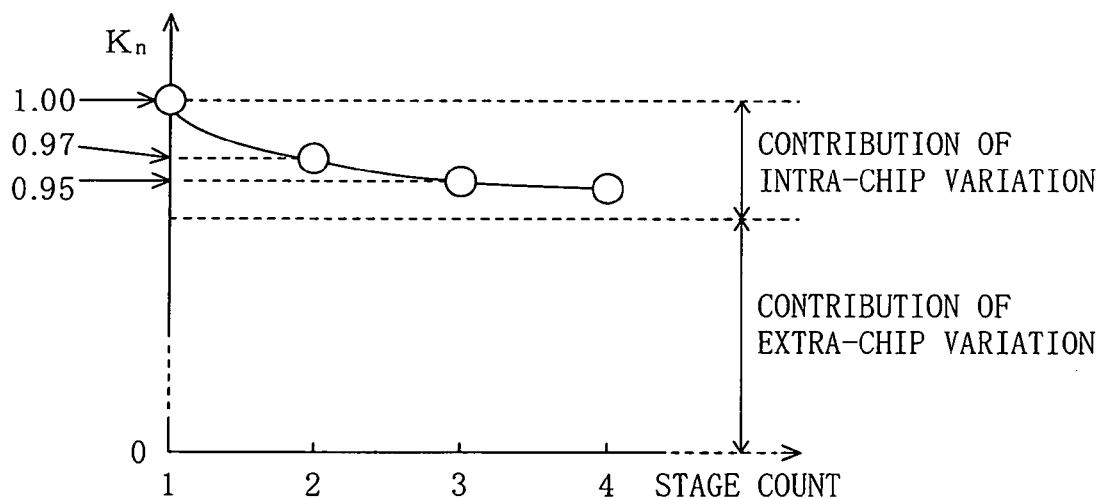
FIG. 5 is a table for listing an exemplified relationship between the number of stages and a derating factor correction coefficient Kn used in Embodiment 1.
FIG. 6 is a graph for showing the relationship between the number of stages and the derating factor correction coefficient Kn shown in FIG. 5.
FIG. 7 is a table for comparing a timing analysis result obtained in a circuit of FIG. 28 in Embodiment 1 and a similar timing analysis result obtained by a conventional method.

FIG. 5 is a table for showing an exemplified relationship between the stage count and the derating factor correction coefficient Kn. FIG. 6 is a graph for showing the relationship between the stage count and the derating factor correction coefficient Kn shown in FIG. 5. It is noted that the relationship between the stage count and the derating factor correction coefficient Kn may be expressed by using a function expression.

It is herein assumed that a distribution of delay times derived from the intra-chip variation is a normal distribution and that the standard deviation is $\sigma$. In the case where a signal path includes circuit cells having the same standard deviation $\sigma i$ and a signal is propagated through these circuit cells, the delay variation caused up to the first stage of circuit cell is $\sigma i$, the delay variation caused up to the second stage of circuit cells is $\sigma i \times \sqrt{2}$, the delay variation caused up to the third stage of circuit cells is $\sigma i \times \sqrt{3}$, and the delay variation caused up to the Nth stage of circuit cells is $\sigma i \times \sqrt{N}$. In the conventional calculation, the delay variation caused up to the first stage is $\sigma i$, the delay variation caused up to the second stage is $\sigma i \times 2$, the delay variation caused up to the third stage is $\sigma i \times 3$, and the delay variation caused up to the Nth stage is σi×N. Therefore, to put it concisely, $1/\sqrt{N}$ is multiplied in order to correct the conventional calculation.

When this idea is applied to the intra-chip variation component of the fabrication variation actually including both the extra-chip variation and the intra-chip variation, the relationship shown in FIGS. 5 and 6 can be obtained. When the stage count N is large, the variation is largely averaged, and hence, the reduction of the derating factor correction coefficient Kn reaches substantially a saturated state. Therefore, the circuit is affected substantially by the extra-chip variation alone. In this case, the lower limit of the derating factor correction coefficient Kn is determined in accordance with the extra-chip variation.

Therefore, the stage count-derating factor dependency 104 previously stores the relationship of FIG. 5 or 6. The relationship between the stage count N and the derating factor correction coefficient Kn is obtained concisely so that contribution of the intra-chip variation shown in FIG. 6 is reduced in accordance with the stage count N in the relationship of $1/\sqrt{N}$ as described above. On the basis of the stage count of the signal path to be analyzed that has been counted and stored by the signal path cell counting means 106, the derating factor correction coefficient Kn to be used for the corresponding signal path is determined.

Timing Analyzing Step

It is herein assumed in the circuit of FIG. 28 that the standard delay time of the circuit cell 501 is 0.1 nS, that of the circuit cell 502 is 0.12 nS, that of the circuit cell 503 is 0.15 nS and these standard delay times are stored in the delay data 102. The timing analysis apparatus 101 reads them from the delay data 102, fetches the derating factor correction coefficient Kn determined with respect to each signal path from the storage device, and performs calculation of the worst delay as follows:

The worst delay of the signal path A is calculated in accordance with the following formula 11:

$tworst[nS]=(0.1+0.12+0.15)\times1.3\times1.15\times1.1\times0.95$    Formula 11:

The worst delay of the signal path B is calculated in accordance with the following formula 12:

$tworst[nS]=(0.1+0.12)\times1.3\times1.15\times1.1\times0.97$    Formula 12:

The worst delay of the signal path C is calculated in accordance with the following formula 13:

$tworst[nS]=(0.1)\times1.3\times1.15\times1.1\times1.0$    Formula 13:

The last item on the right-hand side of each of the formulas 11, 12 and 13 corresponds to the derating factor correction coefficient Kn determined in accordance with the stage count of the signal path A, B or C.

In this manner, the timing analysis apparatus 101 performs the signal path cell counting step S1, the derating factor determining step S2 and the timing analyzing step S3 on all the signal paths included in the circuit to be analyzed (in step S4), and thereafter, it outputs the analysis result 105.

FIG. 7 is a table for comparing the timing analysis result obtained in the circuit of FIG. 28 by using the formulas 11, 12 and 13 and a similar result obtained by the conventional method using the formulas 6, 7 and 8. As shown in FIG. 7, the worst delay obtained by the present invention is more largely smaller than that obtained by the conventional method as the stage count N is larger. This reveals that the conventional problem of an excessive margin is overcome by the present invention.

Specifically, in the conventional method, the derating factor correction coefficient Kn is 1 without distinguishing the extra-chip variation and the intra-chip variation shown in FIG. 6, but in the present invention, the derating factor correction coefficient Kn can be made smaller through averaging of the intra-chip variation. Thus, an excessive margin can be avoided.

In this manner, the derating factor corresponding to the design margin is corrected in accordance with the number of stages of each signal path so that the influence of the intra-chip variation component of the fabrication variation on the circuit delay can be averaged along the signal path, and the delay time is calculated by using the corrected derating factor in this embodiment. As a result, the timing analysis for an LSI in which the actual fabrication variation is taken into consideration can be realized.

The stage count-derating factor dependency 104 may be obtained by various methods other than the method described in this embodiment. For example, it may be determined on the basis of a result obtained by reproducing and analyzing the fabrication variation through circuit simulation using a signal path of an actual circuit.

Figure 8:
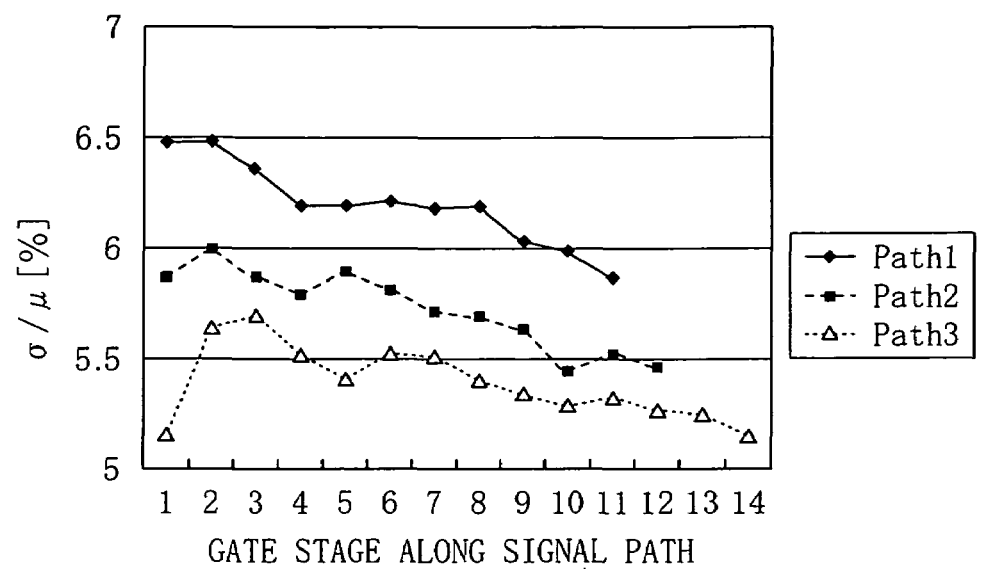
FIG. 8 is a diagram for showing delay variations of three arbitrary signal paths Path1, Path2 and Path3 being averaged along the signal paths.

FIG. 8 shows an example of the analysis of delay variations of three arbitrary signal paths Path1, Path2 and Path3 being averaged along the signal paths. Each line corresponding to the delay variation has slight irregularity along the signal path because sensitivity of the delay variation to the fabrication variation is strictly different among circuit cells. However, the delay variation is roughly averaged along the signal path as shown in FIG. 8. The dependency as shown in FIG. 5 or 6 may be determined on the basis of the simulation result shown in FIG. 8 so as to store it in a database.

Although the derating factor correction coefficients Kn are shown correspondingly to the stage count of ten in FIG. 5 and the stage count of four in FIG. 6 in this embodiment, the derating factor correction coefficients are prepared so as to cover the maximum stage count of a signal path included in the circuit to be analyzed if necessary.

Also, when the stage count is increased, the contribution of the intra-chip variation component illimitably approximates to zero (0) as shown in FIGS. 5 and 6. Therefore, in order to concisely determine the derating factor correction coefficients Kn, a constant value (approximate lower limit value) can be set as the derating factor correction coefficient Kn for signal paths with stage counts of a given value or more, so that this constant derating factor correction coefficient Kn can be uniformly used for these signal paths.

Figure 9:
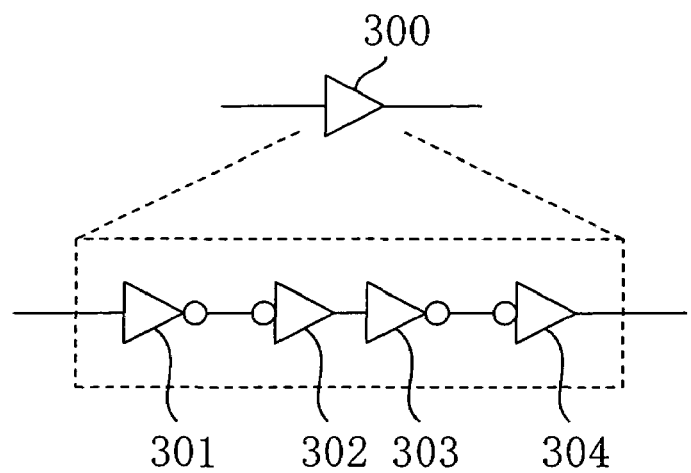
FIG. 9 is a diagram of an example of a circuit cell having an internal structure.

Some circuit cells have a structure that appears to have a single stage but actually has a plurality of stages (elements). For example, a buffer 300 shown in FIG. 9 has an internal configuration composed of four stages of inverters 301, 302, 303 and 304. In other words, this buffer 300 corresponds to four stages although it is one circuit cell. In such a case, the circuit cell is not counted as one stage but counted as four stages in consideration of the internal configuration thereof. Also, when information of the stage count of each kind of circuit cell is previously stored in the LSI design data, a delay time in accordance with the actual stage count can be calculated by referring to the information by the signal path cell counting means 106.

Figure 10A:
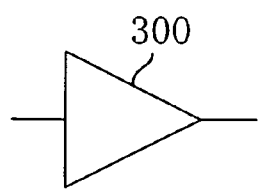
FIGS. 10A, 10B and 10C are diagrams for showing hierarchical structures of circuit cells for explaining a reference in determining the number of stages of each circuit cell.
Figure 10A:
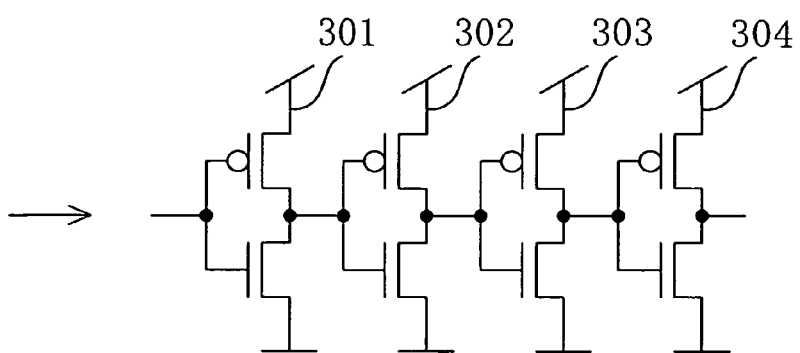
Figure 10B:
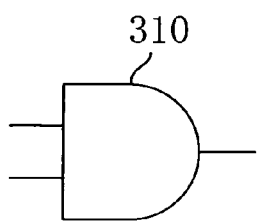
Figure 10B:
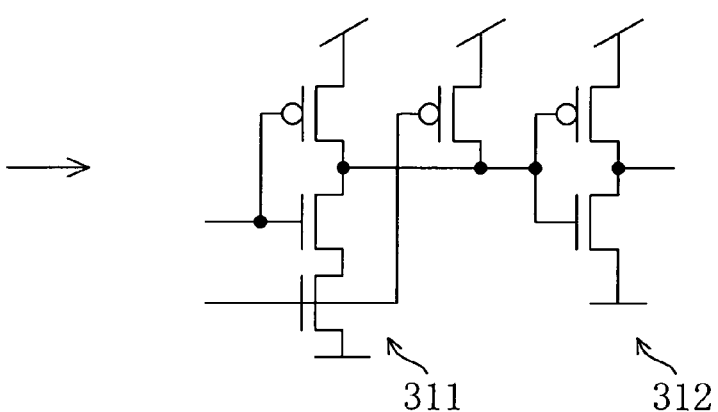
Figure 10C:
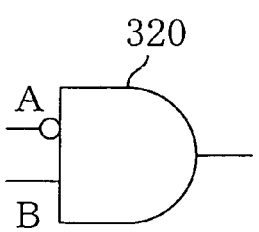
Figure 10C:
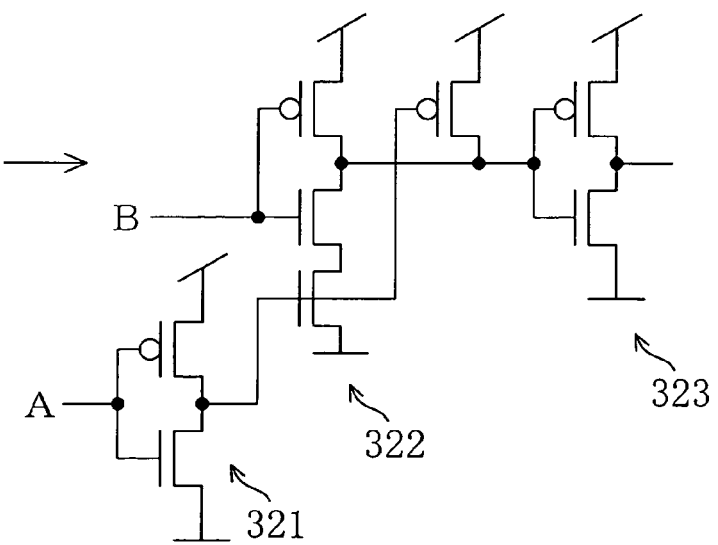

FIGS. 10A through 10C are diagrams for showing the hierarchical structures of cells for explaining a reference to be used in determining the stage counts of respective circuit cells. As shown in FIG. 10A, a buffer 300 includes four stages of inverters 301, 302, 303 and 304 as described with reference to FIG. 9. As shown in FIG. 10B, an AND 310 includes two circuit cells composed of a NAND 311 and an inverter 312. On the other hand, one cell may have different stage counts of circuit cells depending upon signal paths included therein. As shown in FIG. 10C, a cell 320 includes three stages of cell elements 321, 322 and 323 with respect to a path connected to an input terminal A but has two stages of cell elements 322 and 323 with respect to a path connected to an input terminal B. As is understood from FIGS. 10A through 10C, one stage of a circuit cell herein mentioned is composed of one, two or more transistors each receiving one input at a gate thereof.

Furthermore, the stage count N is a natural number of 1, 2, 3, 4, etc. in this embodiment. However, in the case where it is necessary to adjust the accuracy of the derating factor correction coefficient Kn, a real number that is not a natural number and is approximate to the stage count of circuit cells of an actual signal path (such as 3.2) may be used.

Moreover, continuous natural numbers such as 1, 2, 3, 4, etc. are used as the stage counts N in this embodiment. However, when a circuit to be analyzed includes a very large number of stages, discrete natural numbers such as 1, 3, 6, etc. may be set as representative values of the stage counts N with stage counts therebetween (such as 2, 4 and 5) approximated by any of the discrete natural numbers.

Modification 1 of Embodiment 1

Figure 11:
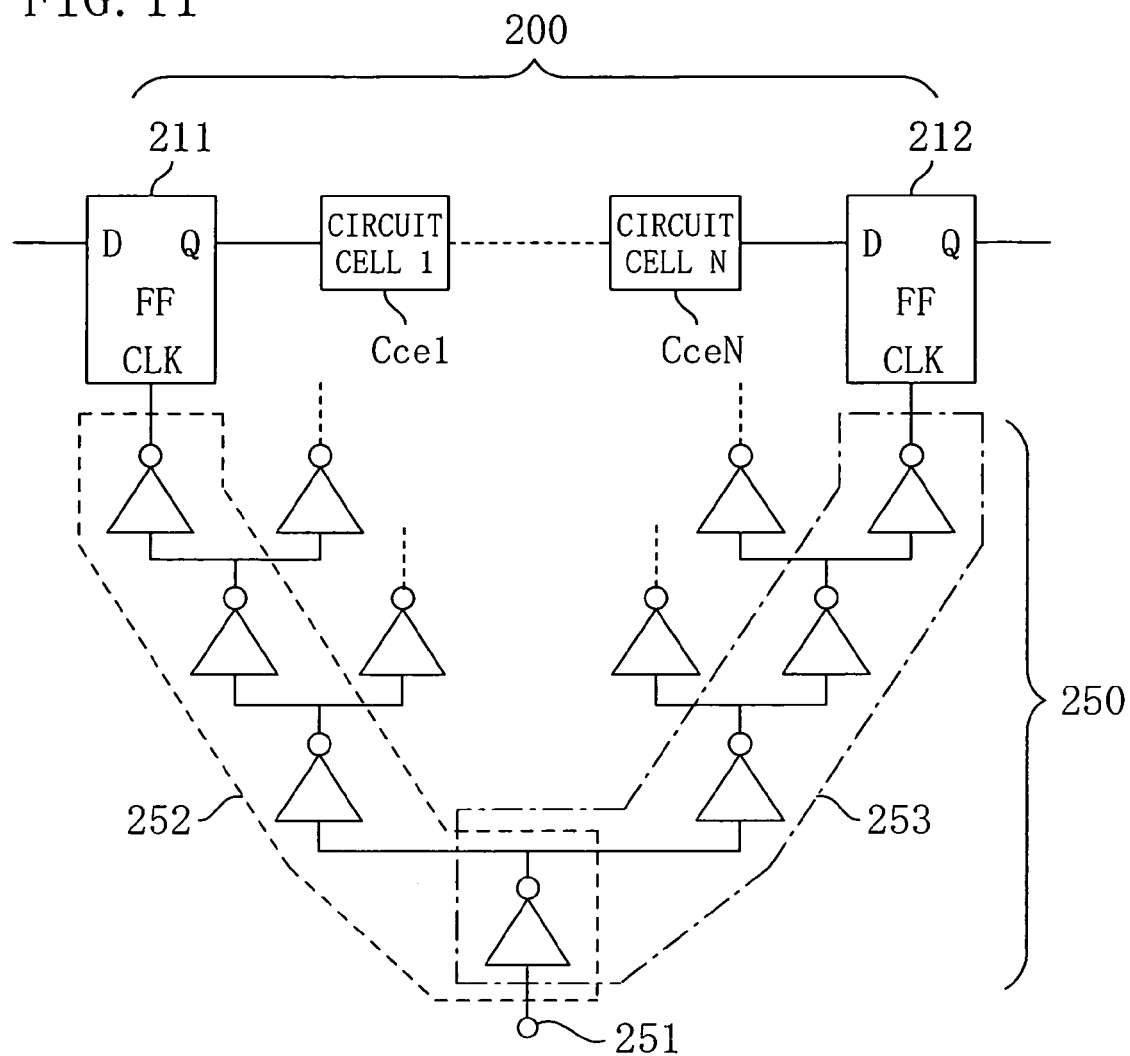
FIG. 11 is a block diagram of a signal path used in Modification 1 of Embodiment 1.

FIG. 11 is a block diagram of a signal path used in Modification 1 of Embodiment 1. In the timing analysis method in consideration of the fabrication variation of Embodiment 1, the two flip-flops 211 and 212 delimiting the one signal path 200 receive a clock signal from the one clock output terminal 201 as shown in FIG. 3.

However, a clock signal supply circuit frequently has a clock tree structure that is successively branched from the root thereof.

Therefore, in Modification 1 shown in FIG. 11, clock terminals CLK of two flip-flops 211 and 212 delimiting a signal path 200 are respectively connected to clock output terminals disposed at the tips of two clock signal paths 252 and 253 of a clock signal supply circuit 250. It is assumed that the same number of buffers are disposed on the two clock signal paths 252 and 253 extending from an input terminal 251 of the clock signal supply circuit 250 to the clock output terminals at the tips. Also in this case, since the two flip-flops 211 and 212 are operated at the same timing, a derating factor correction coefficient Kn in accordance with the stage count of circuit cells disposed therebetween can be used.

Also, the clock signal supply circuit 250 having the clock tree structure itself can be analyzed through the timing analysis of this invention. In the example shown in FIG. 11, each of the clock signal paths 252 and 253 includes four stages of circuit cells (buffers), and therefore, a derating factor correction coefficient Kn determined in accordance with this stage count can be used for calculating a delay time of the clock signal under the best or worst conditions. Although the stage counts of circuit cells (i.e., the number of buffers) provided from the root to the tips of the clock tree are all four in the example shown in FIG. 11, the stage count of circuit cells (the number of buffers) may be different between the clock signal paths.

Modification 2 of Embodiment 1

Furthermore, in the case where an LSI is designed by using a plurality of hierarchies, a signal path may extend over a plurality of circuit blocks. In this case, it is necessary to count the number of stages disposed from the entrance to the exit of a signal path sandwiched between two flip-flops respectively present in different circuit blocks.

Figure 12:
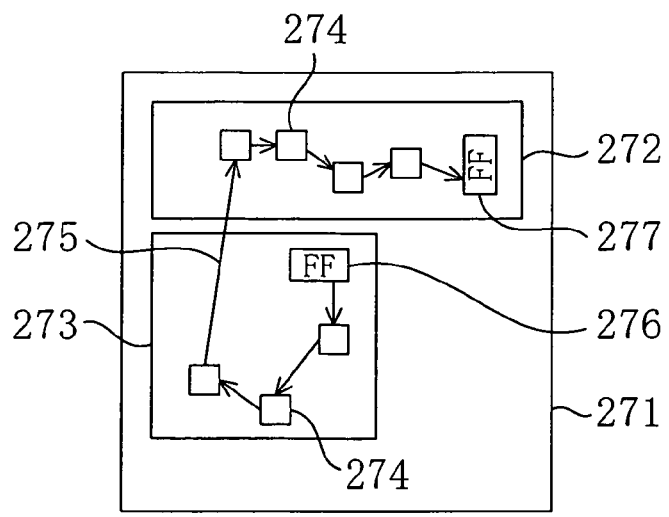
FIG. 12 is a block diagram for showing the architecture of a circuit to be analyzed in Modification 2 of Embodiment 1.

FIG. 12 is a block diagram for showing the structure of a circuit to be analyzed in Modification 2 of Embodiment 1. As shown in FIG. 12, in this modification, a chip 271 includes circuit blocks 272 and 273, and a signal path 275 starting from a flip-flop 276 disposed in the circuit block 273 extends to a flip-flop 277 disposed in the circuit block 272. In other words, the signal path 275 includes circuit cells 274 disposed in the plural circuit blocks 272 and 273. In this case, the stage count of the signal path 275 is three stages in the circuit block 273 and four stages in the circuit block 272, namely, seven stages in total, which are counted by the signal path cell counting means 106 of FIG. 1. Thus, the timing analysis of Embodiment 1 can be performed even on a signal path extending over a plurality of circuit blocks.

Modification 3 of Embodiment 1

Furthermore, the stage count-derating factor dependency as shown in FIGS. 5 and 6 is uniformly applied to the circuit to be analyzed in Embodiment 1. However, this method can be used on the assumption that the contribution ratio between the intra-chip variation component and the extra-chip variation component (see FIG. 6) is constant within one chip. Actually, the ratio between the intra-chip variation and the extra-chip variation may have a distribution within one chip. In such a case, the chip may be divided into a plurality of regions, so that the stage count-derating factor dependency can be defined with respect to each of the divided regions.

Figure 13:
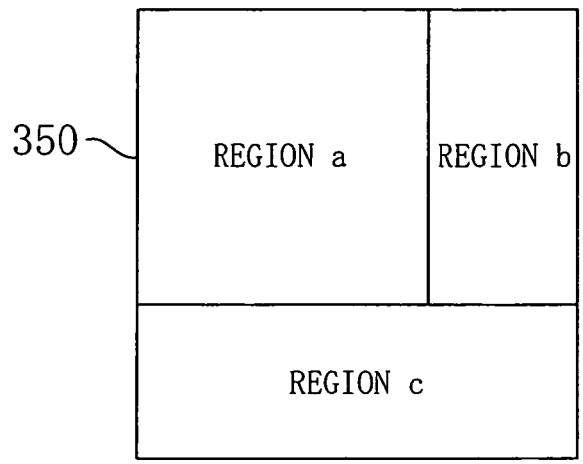
FIG. 13 is a diagram for showing a chip structure used in Modification 3 of Embodiment 1.
Figure 14:
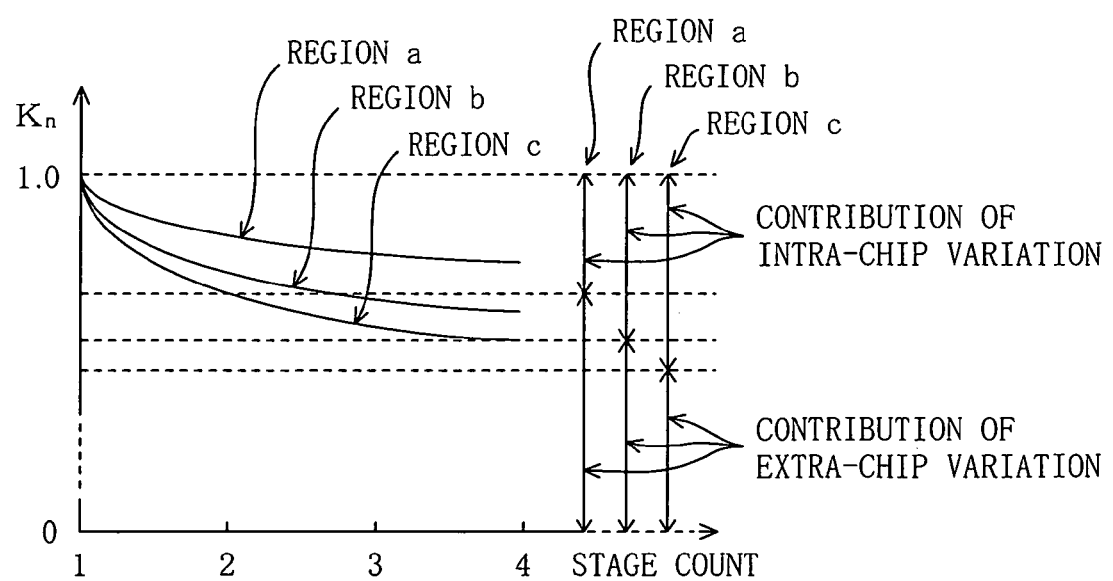
FIG. 14 is a diagram for showing the dependency on the number of stages of the derating factor correction coefficient Kn employed in Modification 3 of Embodiment 1.

FIG. 13 is a diagram for showing the chip structure used in Modification 3 of Embodiment 1. In the structure shown in FIG. 13, the stage count-derating factor dependency is different among regions a, b and c. FIG. 14 is a diagram for showing the stage count-derating factor dependency used in this modification. As shown in FIG. 14, dependency curves similar to that shown in FIG. 6 are defined with respect to the regions a, b and c in this modification. Then, the curve for the region a is used for a signal path disposed in the region a, the curve for the region b is used for a signal path disposed in the region b, and the curve for the region c is used for a signal path disposed in the region c, so as to obtain the derating factor correction coefficients Kn for the respective regions, which are used for the timing analysis.

Calculation of Best Delay

The calculation of the worst delay (the maximum delay) is described in Embodiment 1 and its modifications described above, and the best delay (the minimum delay) is similarly calculated.

Figures 15, 16, 17:
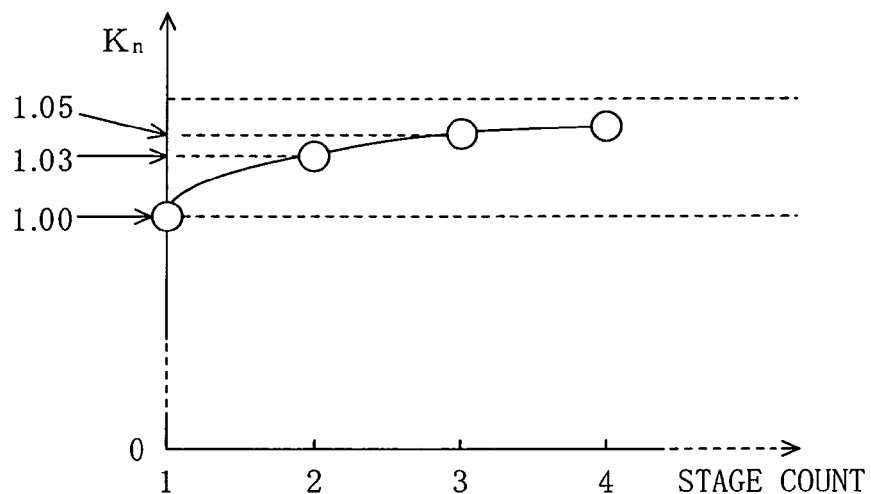
FIG. 15 is a table for showing an exemplified relationship between the number of stages and the derating factor correction coefficient Kn used in calculating a best delay.
FIG. 16 is a graph for showing the exemplified relationship between the number of stages and the derating factor correction coefficient Kn used in calculating a best delay.
FIG. 17 is a table for comparing a timing analysis result obtained about a best delay in the circuit of FIG. 28 in Embodiment 1 and a similar timing analysis result obtained by the conventional method.

FIG. 15 is a table for showing an exemplified relationship between the stage count and the derating factor correction coefficient Kn to be used in calculating the best delay, which corresponds to the table of FIG. 5 used in calculating the worst delay. FIG. 16 is a graph for showing the relationship between the stage count and the derating factor correction coefficient Kn to be used in calculating the best delay, which corresponds to the graph of FIG. 6 used in calculating the worst delay. In the calculation of the best delay, the relationship shown in FIG. 15 or 16 is prepared as the stage count-derating factor dependency 104. Then, in the same manner as in the calculation of the worst delay, the derating factor correction coefficient Kn ($\geq 1.0$) employed for the best delay is obtained, and the best delay is calculated in accordance with the following formula 14:

$$t best = ttyp \times Pbest \times Vbest \times Tbest \times Kn \quad \text{Formula 14:}$$

The resultant best delay is stored in the storage device.

In the case of the circuit shown in FIG. 28, the timing analysis apparatus 101 reads the stored standard delay from the delay data 102, fetches the derating factor correction coefficient Kn determined with respect to each signal path from the storage device and calculates the best delay as follows:

The best delay of the signal path A is calculated in accordance with the following formula 15:

$$tbest[nS]=(0.1+0.12+0.15)\times0.7\times0.85\times0.9\times1.05 \quad \text{Formula 15:}$$

The best delay of the signal path B is calculated in accordance with the following formula 16:

$$tbest[nS]=(0.1+0.12)\times0.7\times0.85\times0.9\times1.03 \quad \text{Formula 16:}$$

The best delay of the signal path C is calculated in accordance with the following formula 17:

$$tbest[nS]=(0.1)\times0.7\times0.85\times0.9\times1.0 \quad \text{Formula 17:}$$

FIG. 17 is a table for comparing the timing analysis result obtained in the circuit of FIG. 28 by using the formulas 15, 16 and 17 and a similar result obtained by the conventional method using the formulas 6, 7 and 8. As shown in FIG. 17, as the stage count is larger, the best delay obtained by the present invention is more largely larger than that obtained by the conventional method. This means that the delay is increased, but also when the operation timing of a circuit cell is too early, there may arise a problem that the design specification is not satisfied in the power consumption or clock skew. Therefore, when the result of the timing analysis of this invention is influenced on the circuit design, the problem that an excessive margin conventionally set toward a smaller delay can be overcome.

Furthermore, it is premised that the standard delay time is stored in the delay data 102 in Embodiment 1 and its modifications described above, which does not limit the timing analysis apparatus and method of this invention. For example, delay times including variations corresponding to the derating factor components P, V and T may be stored in the delay data 102.

It is assumed in the circuit of FIG. 28 that the standard delay time of the circuit cell 501 is 0.16445 nS (=0.1 nS×1.3×1.15×1.1), that the standard delay time of the circuit cell 502 is 0.19734 nS (=0.12 nS×1.3×1.15×1.1), that the standard delay time of the circuit cell 503 is 0.246675 nS (=0.15 nS×1.3×1.15×1.1) and that these standard delay times are stored in the delay data 102. Also in this case, the timing analysis apparatus 101 reads them from the delay data 102, fetches the derating factor correction coefficient Kn determined with respect to each signal path from the storage device, and calculates the worst delay as follows:

The worst delay of the signal path A is calculated in accordance with the following formula 18:

$$tworst[nS]=(0.16445+0.19734+0.246675)\times0.95 \quad \text{Formula 18:}$$

The worst delay of the signal path B is calculated in accordance with the following formula 19:

$$tworst[nS]=(0.16445+0.19734)\times0.97 \quad \text{Formula 19:}$$

The worst delay of the signal path C is calculated in accordance with the following formula 20:

$$tworst[nS]=(0.16445)\times1.0 \quad \text{Formula 20:}$$

The calculation of the best delay is similarly performed.

Furthermore, it is assumed in Embodiment 1 and its modifications described above that the derating factor P always has a constant value of 1.3 with respect to all the circuit cells. However, the value of the derating factor P may be different among the circuit cells in Embodiment 1 and its modifications described above. For example, in the circuit shown in FIG. 28, even in the case where the delay time of the circuit cell 501 is 0.16192 nS (=0.1 nS×1.28×1.15×1.1), the delay time of the circuit cell 502 is 0.19886 nS (=0.12 nS×1.31×1.15×1.1) and the delay time of the circuit cell 503 is 0.24098 nS (=0.15 nS×1.27×1.15×1.1), the worst delay (or the best delay) can be calculated similarly to the calculation using the formulas 18, 19 and 20. Accordingly, the timing analysis can be performed even when the delay data 102 is variously expressed.

Modification 4 of Embodiment 1

In Embodiment 1 and its modifications described above, the derating factor correction coefficient Kn is used to express that the delay times of circuit cells are randomly varied to be averaged along a signal path. However, in some fabrication process, the intra-chip variation may cause delay variation in correlation among circuit cells. In such a case, the relationship between the stage count and the derating factor correction coefficient Kn obtained by using a correlation coefficient R as a parameter is previously prepared, so that the timing analysis apparatus 101 can select dependency corresponding to a desired correlation coefficient when it refers to the stage count-derating factor dependency 104.

Figures 18, 19, 20:
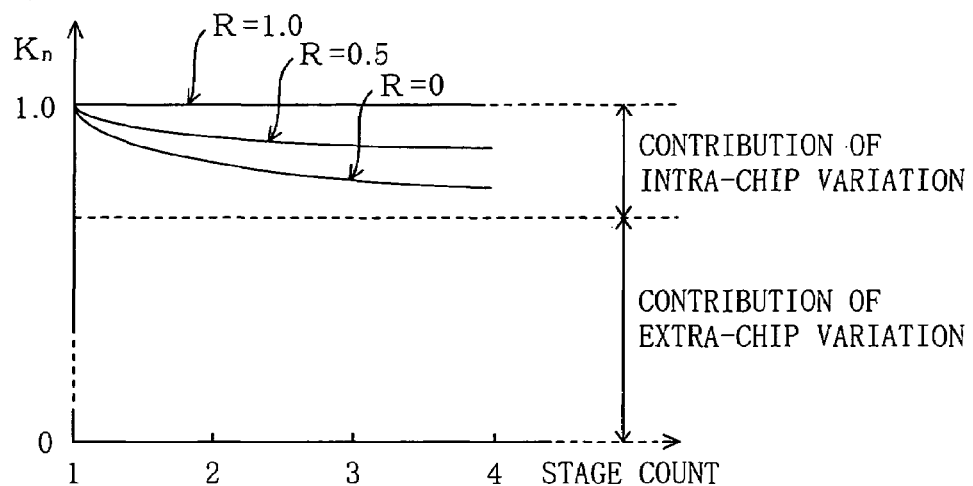
FIG. 18 is a table for showing the dependency on the number of stages of the derating factor correction coefficient Kn obtained with respect to each correlation coefficient in Modification 4 of Embodiment 1.
FIG. 19 is a graph for showing the relationship between the number of stages and the derating factor correction coefficient Kn shown in FIG. 18.
FIG. 20 is a table for comparing a timing analysis result obtained in three signal paths of FIG. 28 in Modification 4 of Embodiment 1 and a similar timing analysis result obtained by the conventional method.

FIG. 18 is a table of the stage count-derating factor dependency of this modification in which the correlation between the stage count and the derating factor correction coefficient Kn has three kinds of correlation coefficients R of 1.0, 0.5 and 0. FIG. 19 is a graph of the stage count-derating factor dependency of this modification in which the correlation between the stage count and the derating factor correction coefficient Kn has the three kinds of correlation coefficients R of 1.0, 0.5 and 0.

When the correlation coefficient R of the variation among circuit cells is 1.0, the delays of all the circuit cells are uniformly varied, and hence, this is considered in the same manner as the conventional fabrication variation. Specifically, the derating factor correction coefficient Kn is not changed in accordance with the stage count and has a constant value of 1.0. On the contrary, when the correlation coefficient R of the variation among circuit cells is 0, the delays of all the circuit cells are completely randomly varied, and hence, the delays are most conspicuously averaged along a signal path. When 0<R<1, averaging in-between occurs. It is herein assumed that the dependency storage part stores the stage count-derating factor dependency 104 including these correlations.

The timing analysis apparatus 101 reads the dependency including the correlation from the LSI design data 110, fetches the derating factor correction coefficient Kn determined with respect to each signal path from the storage device and calculates the worst delay time. In this case, when the correction coefficient R is 0.5, the worst delay of the signal path A is calculated in accordance with the following formula 21:

$$tworst[nS]=(0.1+0.12+0.15)\times1.3\times1.15\times1.1\times0.975 \quad \text{Formula 21:}$$

The worst delay of the signal path B is calculated in accordance with the following formula 22:

$$tworst[nS]=(0.1+0.12)\times1.3\times1.15\times1.1\times0.985 \quad \text{Formula 22:}$$

The worst delay of the signal path C is calculated in accordance with the following formula 23:

$$tworst[nS]=(0.1)\times1.3\times1.15\times1.1\times1.0$$

FIG. 20 is a table for comparing the timing analysis result obtained in the circuit of FIG. 28 in accordance with the formulas 21, 22 and 23 and a similar result obtained by the conventional method using the formulas 6, 7 and 8. In this manner, the present invention is also applicable to the case where the averaging of the intra-chip variation along a signal path is correlative.

As described so far as Embodiment 1 of the invention, as one characteristic of the invention, the timing analysis performed by introducing, into a design margin, the effect that the influence of the intra-chip variation component of the fabrication variation on the delay variation is averaged along a signal path owing to its randomness. Accordingly, a specific embodiment for practicing the present invention is not limited to Embodiment 1 and its modifications.

Embodiment 2

Now, a timing analysis apparatus for an LSI according to Embodiment 2 of the invention in which the fabrication variation is taken into consideration will be described with reference to the accompanying drawings. Herein, redundant parts described in Embodiment 1 will be omitted. Also in this embodiment, the computer system shown in FIG. 2 is used for the timing analysis.

Figure 21:
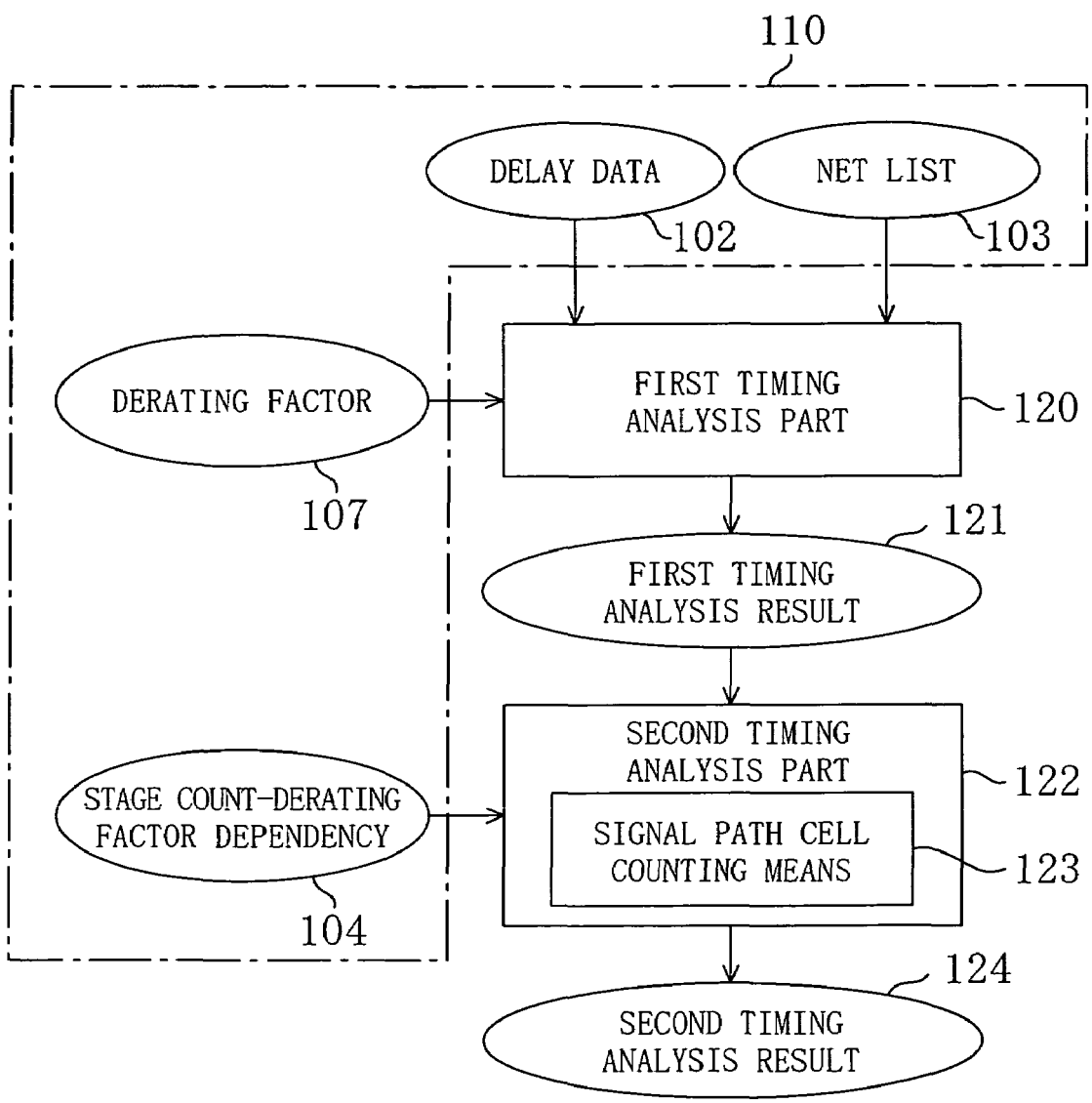
FIG. 21 is a block diagram for showing the architecture of a system used for performing timing analysis for an LSI according to Embodiment 2 of the invention.

FIG. 21 is a block diagram for showing the architecture of a system used for performing the timing analysis for an LSI according to Embodiment 2. As shown in FIG. 21, first and second timing analysis parts 120 and 122 perform the timing analysis on the basis of information supplied from respective information storage parts of LSI design data 110 comprehensively storing information of the LSI. Similarly to Embodiment 1, the LSI design data 110 includes a connection information storage part for storing a net list 103 describing connection information and the like of circuit cells included in the LSI; a delay information storage part for previously storing delay data 102 describing delay information of the circuit cells; a dependency storage part for storing stage count-derating factor dependency 104; and a factor storage part for storing a derating factor (components P, V and T) 107. It is noted that the connection information storage part, the delay information storage part, the dependency storage part and the factor storage part may be included in a memory (storage means) other than the LSI design data 110.

A large difference in the architecture between Embodiment 1 and this embodiment is that the two timing analysis parts having different functions are used in this embodiment.

The first timing analysis part 120 reads the net list 103 including the connection information and the like of the circuit cells of the LSI, the delay data 102 previously storing the delay information of the circuit cells and the derating factor (components P, V and T) 107 and outputs a first timing analysis result 121. This timing analysis result 121 is stored in a storage device.

The second timing analysis part 122 reads the first timing analysis result 121 and the stage count-derating factor dependency 104 and outputs a second timing analysis result 124. Also, the second timing analysis part 122 is provided with signal path cell counting means 123.

The delay data 102 stores information of a delay time of each stage (composed of a path from the input to the output of a given circuit cell and a path from the output through an interconnect connected thereto to the input of a circuit cell disposed at the next stage) of the signal path. The delay data 102 is generated in the same manner as the delay data 102 of Embodiment 1.

The first timing analysis part 120 first reads the derating factor 107 storing the components P, V and T of the derating factor. Next, the worst delay is calculated in accordance with the formula 2. Assuming that the values shown in FIG. 29 are used as the derating factor components P, V and T and that the circuit of FIG. 28 is to be analyzed, the worst delays are calculated in accordance with the formulas 6, 7 and 8. This processing is performed on all signal paths, and the analysis result is output as the first timing analysis result 121.

FIG. 22 is a diagram for showing an example of a format of the first timing analysis result 121. As shown in FIG. 22, in the case of the circuit of FIG. 28, delays of respective circuit cell stages arranged along signal paths are successively described with respect to each signal path in the first timing analysis result 121. In FIG. 22, a first column 121a corresponds to the arrangement of circuit cells from the entrance to the exit, wherein "in" and "out" respectively indicate the input and the output of each circuit cell. A second column 121b corresponds to the delay times of the respective circuit cells. A third column 121c corresponds to accumulated delays of the circuit cells from the entrance of each signal path. A fourth column 121d corresponds to a signal transition direction of the input/output of each circuit cell, wherein "r" indicates a rise waveform and "f" indicates a fall waveform.

Next, the second timing analysis part 122 reads the first timing analysis result 121 stored in the storage device, and the signal path cell counting means 123 counts the number of stages of the circuit cells from the input to the output of each signal path included in the circuit and stores information of the stage count. In the case of the circuit shown in FIG. 28, this information is data as shown in FIG. 22. On the basis of this data, the signal path A present between the input terminal 511 and the output terminal 512 is determined to have three stages of circuit cells, the signal path B present between the input terminal 511 and the output terminal 513 is determined to have two stages of circuit cells and the signal path C present between the input terminal 511 and the output terminal 514 is determined to have one stage of circuit cell.

In the stage count-derating factor dependency 104, the previously obtained relationship between the stage count and the derating factor correction coefficient Kn as shown in FIG. 5 or 6 is stored. The relationship shown in FIG. 5 or 6 is obtained in the same manner as in Embodiment 1. On the basis of the stage count of a signal path to be analyzed that has been counted and held by the signal path cell counting means 123, the derating factor correction coefficient Kn to be used for each signal path is determined and stored in the storage device.

At this point, it is assumed in the circuit shown in FIG. 28 that the standard delay time of the circuit cell 501 is 0.1 nS, that the standard delay time of the circuit cell 502 is 0.12 nS, that the standard delay time of the circuit cell 503 is 0.15 nS and that these standard delay times are stored in the delay data 102. The second timing analysis part 122 reads the first timing analysis result 121, fetches the derating factor correction coefficient Kn determined with respect to each signal path from the storage device and calculates the worst delay time as follows:

The worst delay time of the signal path A is calculated in accordance with the following formula 24:

$$t\text{worst}[nS] = 0.6085 \times 0.95 \qquad \text{Formula 24:}$$

The worst delay time of the signal path B is calculated in accordance with the following formula 25:

$$tworst[nS] = 0.3618 \times 0.97 \quad \text{Formula 25:}$$

The worst delay time of the signal path C is calculated in accordance with the following formula 26:

$$tworst[nS] = 0.1645 \times 1.0 \quad \text{Formula 26:}$$

In this case, the last item on the right-hand sides of each of the formulas 24, 25 and 26 corresponds to the derating factor correction coefficient Kn determined in accordance with the stage count of the signal path A, B or C.

Figure 23:
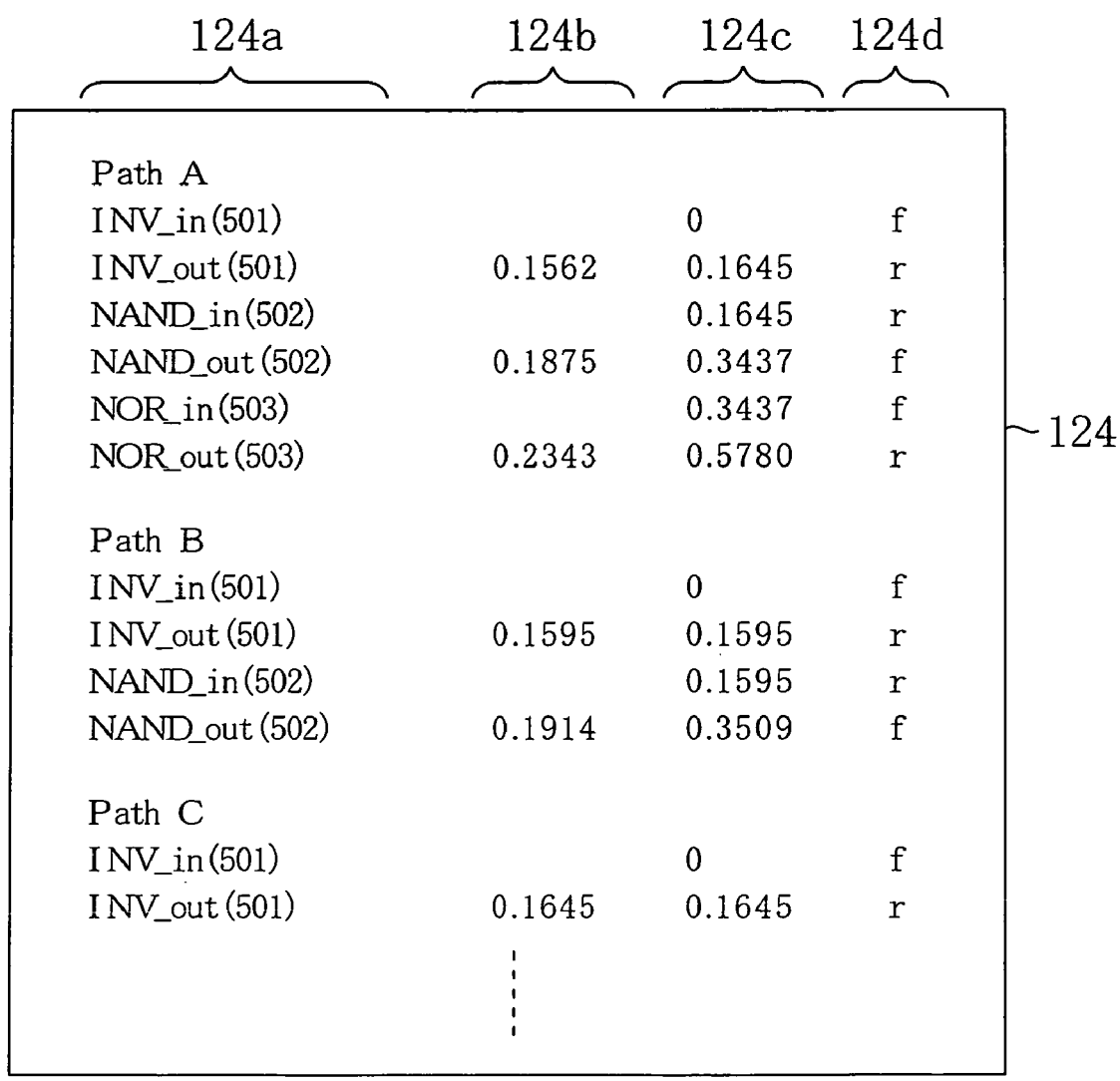
FIG. 23 is a diagram for showing an example of a format of a second timing analysis result used in Embodiment 2.

When the calculation of all the signal paths is completed, the second timing analysis part 122 outputs the second timing analysis result 124. FIG. 23 is a diagram for showing a format of the second timing analysis result 124.

As shown in FIG. 23, the second timing analysis result 124 is different from the first timing analysis result 121 shown in FIG. 22 in such a manner that given random variation of the input/output delay of each signal path is set to be averaged by using the derating factor correction coefficient Kn. Therefore, the accumulated delay caused up to a circuit cell in the middle of a signal path may be different between signal paths even the circuit cells are of the same kind. For example, the delay of an inverter disposed at the first stage of the signal path A (that is, "Path A" of FIG. 23) is 0.1562 nS while the delay of an inverter disposed at the first stage of the signal path B (that is, "Path B" of FIG. 23) is 0.1595 nS. When the results shown in FIGS. 22 and 23 are compared and ordered, the result shown in FIG. 7 is obtained as in Embodiment 1.

In this manner, also in Embodiment 2, as the stage count is larger, the worst delay obtained by the present invention is more largely reduced than that obtained by the conventional method. This reveals that the conventional problem of an excessive margin can be overcome also in Embodiment 2.

As described so far as Embodiment 2, the effect that the influence of the intra-chip variation component of the fabrication variation on the circuit delay is averaged along a signal path is used for correcting derating factor, corresponding to a design margin, by introducing a different derating factor correction coefficient Kn in accordance with the length (stage count) of each signal path, and the delay time is calculated by using the thus corrected derating factor. Accordingly, the timing analysis for an LSI influenced by actual fabrication variation can be performed.

Also, in this embodiment, a conventional timing analysis apparatus can be used as the first timing analysis part 120. Therefore, the timing analysis system of this invention can be more easily realized than in Embodiment 1 by externally providing the second timing analysis part 122 to the conventional timing analysis apparatus.

Embodiment 3

Now, a timing analysis apparatus for an LSI according to Embodiment 3 of the invention in which the non-fabrication variation is taken into consideration will be described with reference to the accompanying drawings. Herein, redundant parts described in Embodiment 1 will be omitted. Also in this embodiment, the timing analysis apparatus 101 shown in FIG. 1 and the computer system shown in FIG. 2 are used for the timing analysis, which is performed in accordance with the flowchart of FIG. 4 as follows:

Signal Path Cell Counting Step

The timing analysis apparatus 101 reads the net list 103 including the connection information and the like of circuit cells included in the LSI and the delay data 102 previously storing delay information of the circuit cells. The net list 103 stores the connection information and the like of the circuit cells included in the circuit subjected to the timing analysis. The delay data 102 stores information of a delay time of each stage (composed of a path from the input to the output of a given circuit cell and a path from the output through an interconnect connected thereto to the input of a circuit cell disposed at the next stage) of the signal path. The delay time itself described in the delay data 102 is determined on the basis of the output load capacitance and the input waveform different among the respective circuit cells by referring to a library corresponding to dependency of the delay time on the output load capacitance and the input waveform of each circuit cell in accordance with the kind of cell. Even the same kind of cells have different delay times when the operation conditions such as the output load capacitance in the circuit and the input waveform are different.

The signal path cell counting means 106 counts the number of stages of the circuit cells arranged from the input to the output of each signal path included in the circuit and stores the information of the stage count. For example, in the circuit shown in FIG. 28, the signal path A present between the input terminal 511 and the output terminal 512 is determined to have three stages of circuit cells, the signal path B present between the input terminal 511 and the output terminal 513 is determined to have two stages of circuit cells, and the signal path C present between the input terminal 511 and the output terminal 514 is determined to have one stage of circuit cell. It is noted that the input terminal 511 and the output terminals 512, 513 and 514 of FIG. 28 are respectively directly connected to flip-flops operated in accordance with a common clock.

Derating Factor Determining Step

The timing analysis apparatus 101 first reads the derating factor 107 including the components P, V and T. At this point, a new derating factor correction coefficient En (wherein $En \leq 1.0$ when there is a negative error and $En \geq 1.0$ when there is a positive error as described below) is introduced. The worst delay is calculated in accordance with the following formula 27:

$$tworst = ttyp \times Pworst \times Vworst \times Tworst \times En \quad \text{Formula 27:}$$

At this point, the coefficient En used in the formula 27 corresponds to the effect that randomly occurring delay errors are averaged along a signal path and is a correction coefficient for correcting the standard delay ttyp. The extent that the delay error variation is averaged along the signal path depends upon the logic depth of the signal path. Herein, the logic depth is assumed to correspond to the number of stages of circuit cells (i.e., the stage count) for simplification. Specifically, when the stage count is small, the extent of averaging is small and the coefficient En has a value largely away from 1.0. On the contrary, when the stage count is large, variation is more averaged, and the correction coefficient En has a value approximated to 1.0. This correction coefficient En is stored in the storage device.

Figure 27A:
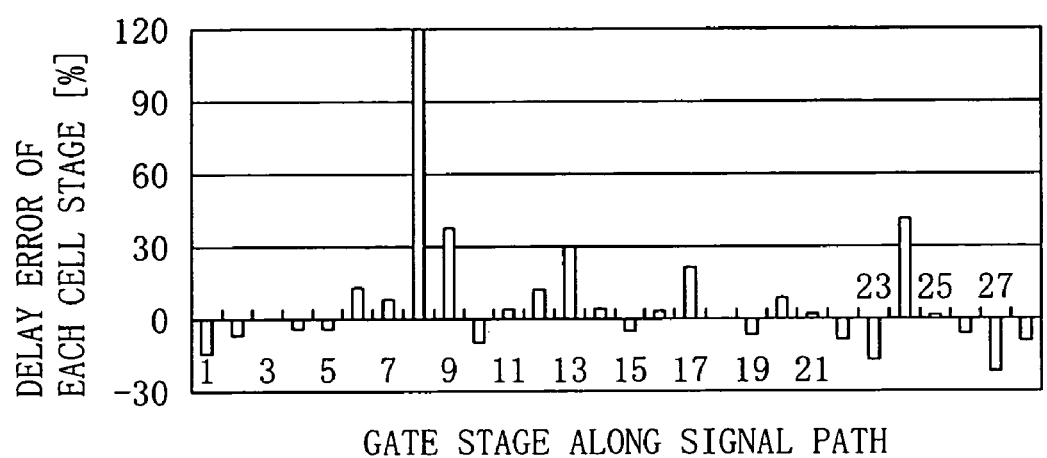
FIGS. 27A and 27B are diagrams for respectively showing a delay error of each circuit cell along a given signal path composed of twenty-eight stages of circuit cells and accumulated delay errors of the signal path.
Figure 27B:
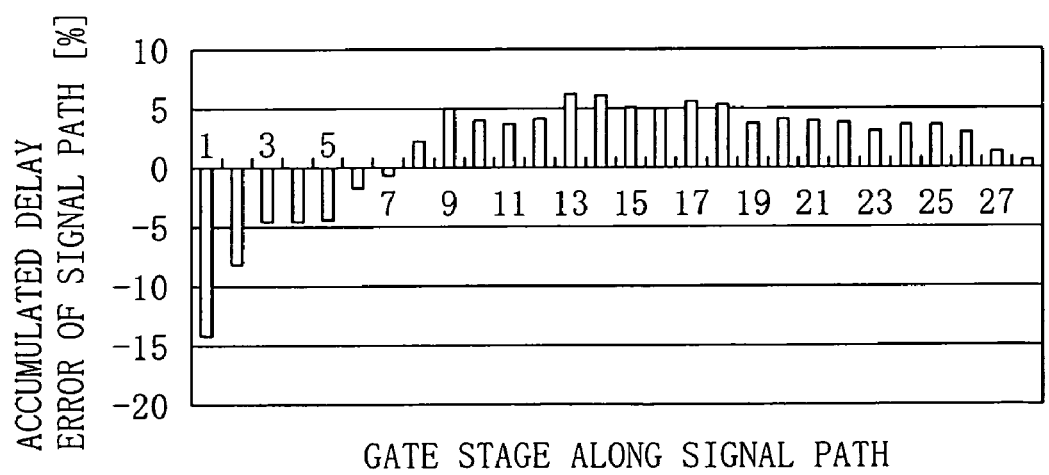
Figure 31:
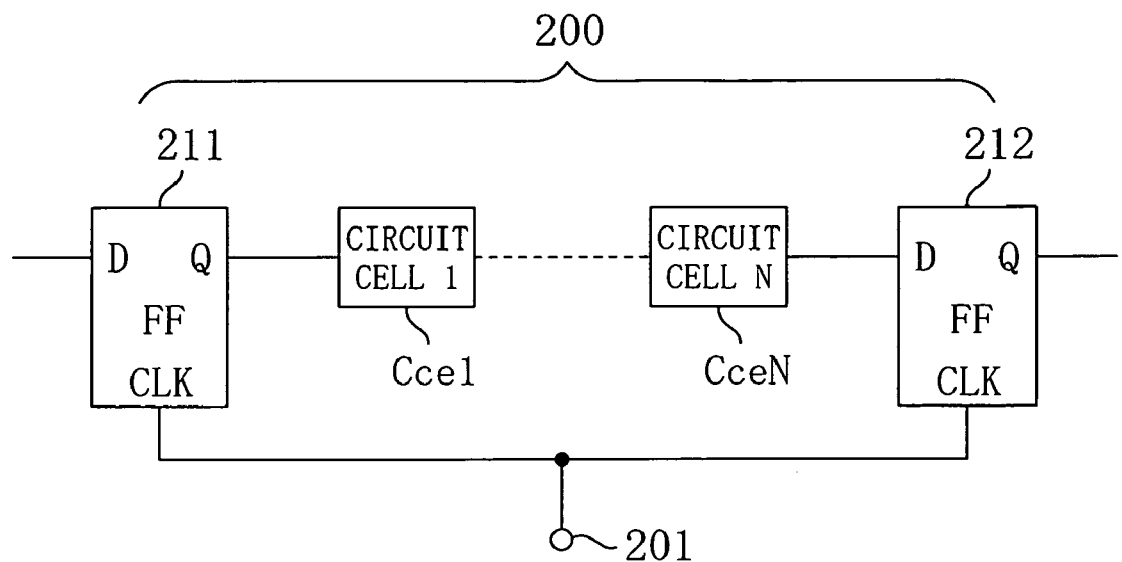
FIG. 31 is a block diagram for showing a unit of a signal path for defining the number of stages of circuit cells in a conventional technique.

The delay error herein means an error of the timing analysis (delay calculation) at the gate level, and may be a difference between a delay of an actually fabricated chip and a delay calculated at the gate level or a difference between a delay obtained through circuit simulation performed at the transistor level and a delay calculated at the gate level. The stage count-derating factor dependency 104 is obtained, for example, as follows:

FIGS. 27A and 27B are diagrams for respectively showing delay errors of circuit cells arranged along a signal path composed of twenty-eight circuit cells and accumulated delay errors of the signal path. In FIGS. 27A and 27B, the abscissa indicates the stage count of cells along the signal path in a direction from the entrance to the exit.

As shown in FIG. 27A, the delay errors are different among the circuit cells, and some circuit cells have a positive delay error and others have a negative delay error. Also, some circuit cells have a large delay error and others have a small delay error.

As shown in FIG. 27B, the absolute values of the delay errors are considerably averaged to be small in the vicinity of the exit of the signal path although they are somewhat irregular. In other words, the delay error is nearly 15% (i.e., En=1.15) at the first stage at the entrance but is approximately 1% (En=1.01) at the 28th stage at the exit. The stage count-derating factor dependency can be determined on the basis of such relationships obtained in various signal paths. In the case where a minus delay error of, for example, −15% is desired to introduce, the coefficient En is determined to be 0.85.

Figures 24, 25, 26:
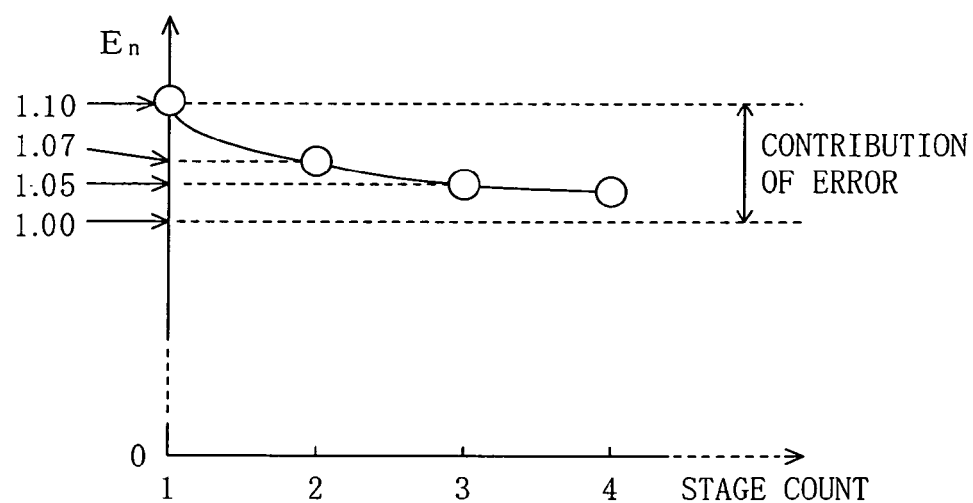
FIG. 24 is a table for showing an exemplified relationship between the number of stages and a correction coefficient En used in Embodiment 3 of the invention.
FIG. 25 is a graph for showing the relationship between the number of stages and the correction coefficient En shown in FIG. 24.
FIG. 26 is a table for comparing a timing analysis result obtained in the three signal paths of FIG. 28 in Embodiment 3 and a similar timing analysis result obtained by the conventional method.

FIG. 24 is a table for showing an example of the relationship between the stage count and the correction coefficient En. Also, FIG. 25 is a graph for showing the relationship between the stage count and the correction coefficient En shown in FIG. 24. It is noted that the relationship between the stage count and the correction coefficient En can be expressed by using a function.

On the basis of the graph of FIG. 25, it is necessary in this case to additionally allow a design margin of an error of 10% in a signal path with one stage. However, in a signal path with three stages, a design margin of an error of merely 5% is additionally necessary.

The stage count-derating factor dependency 104 stores the previously obtained relationship shown in FIG. 24 or 25. In other words, although the relationship between the stage count and the derating factor correction coefficient Kn is stored in Embodiment 1, the relationship between the stage count and the correction coefficient En is stored in Embodiment 3.

Timing Analyzing Step

It is herein assumed in the circuit of FIG. 28 that the standard delay time of the circuit cell 501 is 0.1 nS, that of the circuit cell 502 is 0.12 nS, that of the circuit cell 503 is 0.15 nS and these standard delay times are stored in the delay data 102. The timing analysis apparatus 101 reads them from the delay data 102, fetches the derating factor correction coefficient En determined with respect to each signal path from the storage device and performs calculation of the worst delay as follows:

The worst delay of the signal path A is calculated in accordance with the following formula 28:

$$tworst[nS] = (0.1+0.12+0.15) \times 1.3 \times 1.15 \times 1.1 \times 1.05 \quad \text{Formula 28:}$$

The worst delay of the signal path B is calculated in accordance with the following formula 29:

$$tworst[nS] = (0.1+0.12) \times 1.3 \times 1.15 \times 1.1 \times 1.07 \quad \text{Formula 29:}$$

The worst delay of the signal path C is calculated in accordance with the following formula 30:

$$tworst[nS] = (0.1) \times 1.3 \times 1.15 \times 1.1 \times 1.1 \quad \text{Formula 30:}$$

The last item on the right-hand side of each of the formulas 28, 29 and 30 corresponds to the derating factor correction coefficient En determined in accordance with the stage count of the signal path A, B or C.

In this manner, the timing analysis apparatus 101 performs the signal path cell counting step S1, the derating factor determining step S2 and the timing analyzing step S3 on all the signal paths included in the circuit to be analyzed, and thereafter, it outputs the analysis result 105.

FIG. 26 is a table for comparing the timing analysis result obtained in the circuit of FIG. 28 by using the formulas 28, 29 and 30 and a similar result obtained by the conventional method using the formula 2'. The conventional worst delay shown in FIG. 26 is calculated by substituting En=1.1 in the formula 2'. As shown in FIG. 26, the worst delay obtained by the present invention is more largely smaller than that obtained by the conventional method as the stage count is larger. This reveals that the conventional problem of an excessive margin is overcome in the present embodiment. In addition, there is no need to separately store delay errors of respective kinds of circuit cells as a database as in the technique disclosed in Japanese Laid-Open Patent Publication No. 9-311877.

As described so far as Embodiment 3, the effect that the influence of the delay error, that is, the factor other than those derived from the fabrication, on the circuit delay is averaged along a signal path is used for correcting derating factor, corresponding to a design margin, by introducing a different derating factor correction coefficient En in accordance with the stage count of each signal path, and the delay time is calculated by using the thus corrected derating factor. Accordingly, the timing analysis for an LSI influenced by actual non-fabrication variation can be performed.

Although the derating factor correction coefficient En for averaging the variation factor of the simulation is introduced in the timing analysis of this embodiment, the derating factor correction coefficient Kn for averaging the fabrication variation factors used in Embodiments 1 and 2 may be also introduced. In this case, an excessive margin can be avoided through the synergistic effect of both the coefficients, resulting in exhibiting a remarkable effect.

In this manner, the present invention is usable, in development or the like of an LSI composed of CMOS devices and the like, as a method or an apparatus for performing timing analysis in consideration of various variations.

What is claimed is:

1. A timing analysis method for analyzing timing of an LSI including a plurality of signal paths in each of which a plurality of circuit cells are serially connected to one another, comprising the steps of:
    (a) detecting a logic depth of each of said signal paths by using information of said plurality of circuit cells included in said LSI stored in LSI design data;
    (b) calculating a design margin of each of said signal paths corrected in accordance with said logic depth of the corresponding signal path and storing said corrected design margin of said signal path in storage means; and
    (c) calculating a delay into which said corrected design margin of each of said signal paths fetched from said storage means is incorporated.

2. The timing analysis method of claim 1, wherein a number of stages of said plurality of circuit cells included in each of said signal paths is used as said logic depth.

3. The timing analysis method of claim 1, wherein a derating factor and a correction coefficient for said derating factor are used as said design margin, and said correction coefficient of said design margin of each of said signal paths is calculated in accordance with said logic depth of the corresponding signal path in the step (b).

4. The timing analysis method of claim 1, wherein a relationship between a logic depth and an extent of averaging of delay variation of each of said signal paths is previously stored in said LSI design data or another storage means, and said corrected design margin is obtained by using said relationship between said logic depth and the extent of averaging of delay variation of the corresponding signal path in the step (b).

5. The timing analysis method of claim 4,
wherein the averaging of delay variation includes averaging of delay variation caused in fabrication by random variation of an intra-chip component.

6. The timing analysis method of claim 4,
wherein the averaging of delay variation includes averaging of delay errors.

7. The timing analysis method of claim 1,
wherein each of said plurality of signal paths is sandwiched between two flip-flops operated at the same timing.

8. The timing analysis method of claim 1,
wherein said plurality of signal paths include a signal path included in a clock line supply circuit and having a clock tree structure in which circuit cells are arranged.

9. The timing analysis method of claim 1,
wherein said design margin is calculated through correction in a different ratio in accordance with a region where each of said signal paths is disposed within a chip in the step (b).

10. A timing analysis method for analyzing timing of an LSI including a plurality of signal paths in each of which one, two or more circuit cells are disposed, comprising the steps of:

(a) obtaining a delay of each of said plurality of signal paths by using information of said circuit cells included in said LSI stored in LSI design data and a derating factor not corrected, and storing said obtained delay as a pre-correction timing analysis result in first storage means;

(b) calculating a logic depth of each of said signal paths by using information of said circuit cells included in said LSI stored in a cell library;

(c) calculating a correction value for a design margin of each of said signal paths in accordance with said logic depth of the corresponding signal path and storing said correction value of said design margin of each of said signal paths in second storage means; and (d) correcting said pre-correction timing analysis result fetched from said first storage means with said correction value fetched from said second storage means, whereby calculating a delay into which a corrected design margin of the corresponding signal path is incorporated.

11. A timing analysis apparatus for analyzing timing of an LSI including a plurality of signal paths in each of which a plurality of circuit cells are serially connected to one another, comprising:

logic depth detecting means for detecting a logic depth of each of said plurality of signal paths;

design margin determining means for calculating a corrected design margin of each of said signal paths by using said detected logic depth of the corresponding signal path; and timing analyzing means for calculating a delay of each of said signal paths into which said corrected design margin of the corresponding signal path is incorporated.

* * * * *